(12) United States Patent
Ihnfeldt et al.

(10) Patent No.: US 10,451,321 B2
(45) Date of Patent: Oct. 22, 2019

(54) SOLID STATE COOLING DEVICE

(71) Applicants: General Engineering & Research, L.L.C., San Diego, CA (US); The Regents of the University of California, Oakland, CA (US)

(72) Inventors: Robin Veronica Ihnfeldt, San Diego, CA (US); Xia Xu, San Diego, CA (US); Renkun Chen, San Diego, CA (US); Sungho Jin, San Diego, CA (US); Jianlin Zheng, La Jolla, CA (US)

(73) Assignees: General Engineering & Research, L.L.C., San Diego, CA (US); The Regents of The University of California, Oakland, CA (US)

( * ) Notice: Subject to any disclaimer, the term of this patent is extended or adjusted under 35 U.S.C. 154(b) by 229 days.

(21) Appl. No.: 15/694,616

(22) Filed: Sep. 1, 2017

(65) Prior Publication Data

US 2018/0066875 A1    Mar. 8, 2018

Related U.S. Application Data

(60) Provisional application No. 62/383,363, filed on Sep. 2, 2016.

(51) Int. Cl.
*F25B 21/00* (2006.01)
*H01L 35/32* (2006.01)
(Continued)

(52) U.S. Cl.
CPC ............. *F25B 21/00* (2013.01); *H01L 35/32* (2013.01); *H01L 37/04* (2013.01);
(Continued)

(58) Field of Classification Search
CPC .. F25B 21/00; F25B 41/04; F25B 2321/0023; F25B 2321/0022; F25B 2321/001;
(Continued)

(56) References Cited

U.S. PATENT DOCUMENTS 4,642,994 A * 2/1987 Barclay ................... F25B 21/00
  505/890
6,588,215 B1   7/2003 Ghoshal
(Continued)

FOREIGN PATENT DOCUMENTS

CN          103312230      9/2013
WO     WO 2007001290      1/2007

OTHER PUBLICATIONS

D.J. Silva et. al, Applied Energy, 93, 570 (2012).

*Primary Examiner* — Frantz F Jules
*Assistant Examiner* — Lionel Nouketcha
(74) *Attorney, Agent, or Firm* — Knobbe, Martens, Olson & Bear, LLP

(57) ABSTRACT

This invention relates to a cooling device which utilizes both thermoelectric and magnetocaloric mechanisms for enhanced cooling applications. Using high thermal conductivity magnetocaloric composites in conjunction with thermoelectric elements acting as thermal switches which are electrically coupled to a magnetization and demagnetization cycle enables the use of larger quantities of magnetocaloric material, and high efficiency solid state cooling can be achieved. Solid state cooling devices are useful for a variety of industrial applications which require cooling, such as, but not limited to cooling of microelectronic devices, cooling on space platforms, etc.

20 Claims, 13 Drawing Sheets

(51) Int. Cl.
*H01L 37/04* (2006.01)
*H01L 35/14* (2006.01)

(52) U.S. Cl.
CPC ......... *F25B 2321/002* (2013.01); *H01L 35/14* (2013.01); *Y02B 30/66* (2013.01)

(58) Field of Classification Search
CPC .... F25B 2321/002; F25B 30/00; F25D 17/02; F25D 11/02; F25D 19/006; Y02B 30/66
See application file for complete search history.

(56) References Cited

U.S. PATENT DOCUMENTS

| | | | | |
|---|---|---|---|---|
| 6,588,216 | B1 * | 7/2003 | Ghoshal | F25B 21/00 62/3.1 |
| 2013/0186107 | A1 * | 7/2013 | Shih | F25B 21/00 62/3.1 |
| 2014/0338365 | A1 * | 11/2014 | Tasaki | F25B 21/00 62/3.1 |

* cited by examiner

Magnetization/demagnetization time: 12 S; $V_{TE}$: 1 V

SOLID STATE COOLING DEVICE

CROSS-REFERENCE TO RELATED APPLICATIONS

This application claims priority to U.S. Provisional Patent Application No. 62/383,363 filed on Sep. 2, 2016 entitled "SOLID STATE COOLING DEVICE", the content of which is incorporated herein by reference in its entirety.

STATEMENT REGARDING FEDERALLY SPONSORED R&D

This invention was made with government support under grant No. N00173141G016 awarded by the Naval Research Laboratory. The government has certain rights in the invention.

BACKGROUND OF THE INVENTION

Field of the Invention

Embodiments of the present invention generally relate to a cooling device which utilizes both thermoelectric and magnetocaloric mechanisms for enhanced cooling applications. Using high thermal conductivity magnetocaloric composites in conjunction with thermoelectric elements acting as thermal switches which are electrically coupled to a magnetization and demagnetization cycle enables the use of effective quantities of magnetocaloric material, and high efficiency solid state cooling can be achieved. Solid state cooling devices are useful for a variety of industrial applications which require cooling, such as, but not limited to cooling of microelectronic devices, cooling on space platforms, etc.

Description of the Related Art

As refrigeration and cooling systems account for greater than 10 quads of U.S. primary energy consumption, a more efficient cooling technology could significantly reduce energy consumption, and have a profound impact on our society. Most conventional air conditioners, heat pumps, and refrigerators achieve cooling through a mechanical vapor compression cycle (VCC) which requires large amounts of energy and has an adverse environmental impact due to the use of hydrofluorocarbons (HFCs). New technologies that have made progress in the last decade are thermoelectric cooling (TEC) modules and magnetic refrigeration. TEC uses the Peltier effect which creates a heat flux by applying an electric field. The thermoelectric effect was described by H. J. Goldsmid, *Thermoelectric Refrigeration*, Plenum Press (1964). Magnetic refrigeration utilizes the magnetocaloric effect (MCE), which is the temperature variation of a magnetic material after exposure to a magnetic field. The magnetocaloric effect was first described by Weiss, Pierre and Piccard, Auguste, *Journal of Physics*, (7) 103 (1917).

TEC modules are at the forefront of new technology for many applications because they do not use liquids or pumps and have no moving parts, yielding an indefinite device lifetime. However, the drawback of current TEC technologies is their poor efficiency.

MCE technologies have also drawn tremendous attention due to the possibility of good energy efficiency and environmental friendliness. However, the MCE materials must operate in a predetermined temperature range and development of magnetic coolers that can span a large temperature range has, to this point, been unsuccessful.

While much work has been done on these two mechanisms separately, there are only a handful of references which utilize both mechanisms. Chinese Patent Application 103312230 discloses a magnetic heating thermoelectric generator where a magnetic force is used to generate the heat on the hot side of a thermoelectric module, thus allowing electricity generation across the thermoelectric module due to the temperature gradient between the hot side and cold side.

Additionally, there are several magnetocaloric refrigeration systems that have been previously disclosed which incorporate thermoelectric elements. U.S. Pat. No. 6,588,215 discloses an apparatus and methods for performing switching in magnetic refrigeration systems using inductively coupled thermoelectric switches wherein the magnetic cooling system comprises a magnetocaloric material and at least one thermoelectric switch that is energized indirectly by a magnetic coupling, wherein the thermoelectric is used to switch between a heat rejection and heat absorption phase of a magnetic cooling cycle. PCT Patent application WO2007001290 disclosed a combination thermo-electric and magnetic refrigeration system wherein the refrigeration system comprises a compartment, a first cooling device, said first cooling device cooling said compartment and generating a magnetic field, and a second device, wherein said second device uses said generated magnetic field for additional cooling. D. J. Silva et. al, *Applied Energy*, 93, 570 (2012), developed a model for a solid state cooling module utilizing the magnetocaloric effect instead of thermoelectric materials. However, their theoretical device requires a nonexistant insulative material whose thermal conductivity changes with application of a magnetic field.

SUMMARY OF THE INVENTION

Some embodiments of the present invention provide a cooling device comprising a hot side, a cold side, at least two thermoelectric layers, at least one magnetocaloric composite, and a magnetic field. In some embodiments, the at least one magnetocaloric composite is positioned in between the at least two thermoelectric layers. In some embodiments, the at least one magnetocaloric composite comprises at least one magnetocaloric material and at least one thermally conductive material with thermal conductivity greater than 75 W/(m K) at the operating temperature of the cooling device, wherein the magnetocaloric material and the thermally conductive material are not the same. In some embodiments, the magnetic field enables the magnetocaloric effect of the magnetocaloric material in the magnetocaloric composite when at least one magnetization and demagnetization cycle is performed, wherein a change in temperature of the magnetocaloric material occurs when the magnetocaloric material is exposed to changes in magnetic field force. In some embodiments, the at least one magnetization and demagnetization cycle comprises increasing the magnetic field force on the magnetocaloric material at a predefined magnetic field ramp-up speed, maintaining the increased magnetic field on the magnetocaloric material for a specified holding time, decreasing the magnetic field force on the magnetocaloric material at a predefined ramp-down speed, and maintaining the decreased magnetic field on the magnetocaloric material for a specified time. In some embodiments, the at least two thermoelectric layers operate separately to move heat from the cold side of the device to the hot side of the device when a DC current is applied in a specified direction, wherein the DC current applied to each thermoelectric layer is electrically coupled to the magnetization and demagnetization cycle of the magnetocaloric material such that one thermoelectric layer operates to allow heat rejection from the magnetocaloric composite to the hot side and one thermoelectric layer operates to allow heat absorption to the magnetocaloric composite from the cold side.

In some embodiments, the thermoelectric layers comprise pellets of at least one p-type thermoelectric material and at least one n-type thermoelectric material, wherein the pellets are arranged electrically in series and thermally in parallel. In some embodiments, the thermoelectric layers comprise commercially available thermoelectric cooling modules.

Various thermoelectric materials can be used in the thermoelectric layers of the cooling device. In some embodiments, the thermoelectric layers comprise a material selected from the group consisting of bismuth based alloys, lead telluride based alloys, carbon based materials, inorganic clathrate materials, magnesium based materials, silicides, skutterudite materials, oxide materials, Half Heusler alloys, silicon-germanium based materials, sodium-cobalt based materials, or any combination thereof. In some embodiments, the thermoelectric material may be further doped to create either p-type or n-type thermoelectric material. In some embodiments, the thermoelectric material comprises doped or un-doped BiSbTe, doped or un-doped BiSb, doped or un-doped BiSeTe, doped or un-doped BiTe, or any combination thereof. In some embodiments, the thermoelectric pellets further comprise iron.

In some embodiments, the thermoelectric pellets comprise at least one nano-grained material, wherein the nano-grained material has at least one of its dimensions in the range of about 1 nm to about 100 nm.

In some embodiments, the efficiency (ZT) of the thermoelectric material is enhanced with application of a magnetic field.

Various forms of the magnetocaloric composite are possible. In some embodiments, the magnetocaloric composite comprises a thermally conductive matrix, wherein the magnetocaloric material is dispersed homogenously throughout the thermally conductive matrix. In some embodiments, the magnetocaloric composite comprises alternating layers of magnetocaloric material and thermally conductive material. In some embodiments, the alternating layers of magnetocaloric material and thermally conductive material are parallel to the direction of heat flow in the cooling device. In some embodiments, more than one thermally conductive material is used on the magnetocaloric composite. In some embodiments, thermally conductive adhesives may be used to adhere the thermally conductive material to the magnetocaloric material. In some embodiments, the thickness of at least one of the layers of magnetocaloric material within the magnetocaloric composite is between about 10 nm and 5 mm. In some embodiments, the thickness of at least one of the layers of thermally conductive material is between about 10 nm and about 5 mm.

The magnetocaloric effect includes any phenomenon in which the temperature change of a material is caused by exposing the material to a changing magnetic field.

In some embodiments, the temperature of the magnetocaloric material increases when the magnetic field is moved near or in contact with the magnetocaloric material, and wherein the temperature of the magnetocaloric material decreases when the magnetic field is moved away from the magnetocaloric material. In some embodiments, the magnetocaloric material comprises a Gd based alloy. In some embodiments, the magnetocaloric material exhibits an inverse magnetocaloric effect, wherein the temperature of the magnetocaloric material decreases when the magnetic field is moved near or in contact with the magnetocaloric material, and wherein the temperature of the magnetocaloric material increases when the magnetic field is moved away from the magnetocaloric material. In some embodiments, the magnetocaloric material is a Heusler alloy.

Various magnetocaloric materials can be used in the cooling device. In some embodiments, the magnetocaloric material is selected from the group consisting of Gd, Gd based alloy's, NiMn based alloys, La based alloys, Nd based alloys, Dy based alloys, Pr based alloys, MnAs based alloys, Er based alloys, Tm based alloys, FeNi based alloys, and any combination thereof. In some embodiments, the magnetocaloric material is a NiMn based alloy. In some embodiments, the magnetocaloric material further comprises Fe.

In some embodiments, the magnetocaloric material comprises at least one nano-grained material, wherein the nano-grained material has at least one of its dimensions in the range of about 1 nm to about 100 nm.

Various thermally conductive materials can be used in the cooling device. In some embodiments, the thermally conductive material comprises a metal. In some embodiments, the thermally conductive material is selected from the group consisting of copper, aluminum, diamond, gold, silver, brass, steel, graphene, graphite, iron, lead, nickel, indium, tin, tungsten, zinc, or any combination thereof. In some embodiments, the thermally conductive material has a thermal conductivity greater than 75 W/(m K). In some embodiments, the thermally conductive material has a thermal conductivity greater than 100 W/(m K). In some embodiments, the thermally conductive material has a thermal conductivity greater than 200 W/(m K). In some embodiments, the thermally conductive material comprises copper.

In some embodiments, the magnetocaloric composite is electrically isolated from the thermoelectric layers.

In some embodiments, the magnetocaloric material is magnetized at a magnetic field ramp-up speed of between about 0.001 Tesla per second to about 3 Tesla per second.

In some embodiments, the magnetic field holding time during the magnetization and demagnetization cycle is between about 0.01 seconds to about 1 minute.

In some embodiments, the magnetocaloric material is demagnetized at magnetic field ramp-down speed of between about 3 Tesla per second to about 0.001 Tesla per second.

In some embodiments, the removed holding time for zero magnetic field during the magnetization and demagnetization cycle is between about 0.01 seconds to about 1 minute.

Various methods may be used to fabricate the thermoelectric pellets. In some embodiments, the thermoelectric pellets are fabricated by hydraulic pressing, hot pressing, sintering, swagging, or any combination thereof.

Various methods may be used to fabricate the magnetocaloric composite into pellet or plate or block form. In some embodiments, the magnetocaloric composite is fabricated into the desired structure for the cooling device by hydraulic pressing, hot pressing, sintering, swagging, or any combination thereof.

Any magnet capable of producing a magnetic field large enough to induce the magnetocaloric effect of the magnetocaloric material may be used in the cooling device. In some embodiments, the magnetic field is supplied by an electromagnet. In some embodiments, the magnetic field is supplied by a superconducting magnet. In some embodiments, the magnetic field is supplied by a permanent magnet. In some embodiments, the permanent magnet is selected from the group consisting of a rare earth magnet, ceramic magnets, AlNiCo based magnets, or any combination thereof. In some embodiments, the permanent magnet material is selected from NdFeB, AlNiCo, SmCo, Ferrite, Femite, FeCrCo, or any combination thereof. In some embodiments, the permanent magnet has a magnetic field of between about 0.01 Tesla to about 2 Tesla. In some embodiments, the permanent magnet has a magnetic field of between about 0.1 Tesla to about 1.5 Tesla.

Additional materials or components may be used in the cooling device. In some embodiments, the cooling device further comprising metal or ceramic plates, metal or ceramic foil, metal or ceramic wires, metal or ceramic spacers, metal or ceramic substrates, soft magnetic shielding materials, adhesives, soldering materials, frame and/or mounting substrates, or any combination thereof.

Some embodiments of the invention provide a method of removing unwanted heat from an apparatus or a surface comprising adhering the cool side of the disclosed cooling device to a surface of the apparatus, applying the DC currents in a specified direction to separately activate the thermoelectric layers, activating the magnetic field system to perform the at least one magnetization and demagnetization cycle. In some embodiments of the method, the hot side of the cooling device further comprises a heat sink and/or a convection cooling system.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the embodiments which follow.

BRIEF DESCRIPTION OF THE DRAWINGS

FIG. 4 also describes the magnetization and demagnetization cycle of an embodiment of the cooling device.

DETAILED DESCRIPTION

Figure 1:
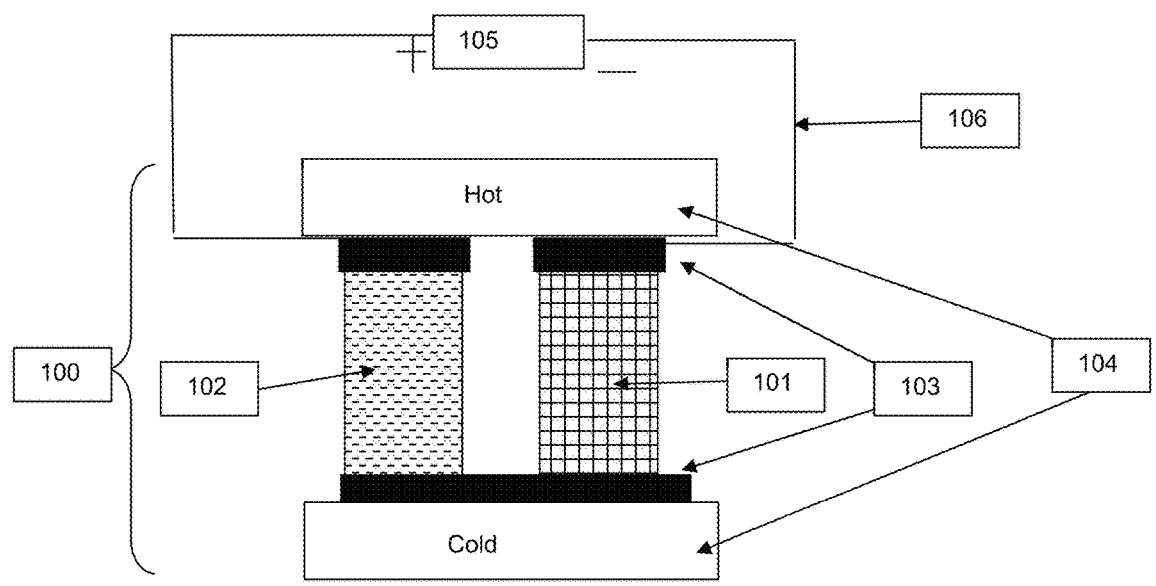
FIG. 1 illustrates an embodiment of a thermoelectric module comprising at least one thermoelectric element.

While much work has been performed on the thermoelectric cooling and magnetocaloric mechanisms separately, there is little known work which experimentally documents the simultaneous use of both mechanisms. D. J. Silva et. al, *Applied Energy,* 93, 570 (2012) and A. Kitanovski et al., *International Journal of Refrigeration,* 33, 449 (2010) both theoretically proposed solid state cooling modules utilizing the magnetocaloric effect which are believed to provide high efficiency refrigeration. However, as was demonstrated theoretically, only a thin layer of magnetocaloric material can be used as the diffusion time of heat through this layer is limited by the low thermal conductivity of these materials. The amount of heat that is transferred in a magnetocaloric cooling cycle (also known as the refrigeration capacity) is directly related to the mass of the magnetocaloric material in the system. Thus, with devices only capable of functioning when very small quantities of magnetocaloric material are used, the actual refrigeration capacity becomes negligible and eliminates any practical application of this type of device. Surprisingly, the inventors have discovered a structure for a solid state cooling device which utilizes both the magnetocaloric effect and thermoelectric elements. Using high thermal conductivity magnetocaloric composites in conjunction with thermoelectric elements acting as thermal switches which are electrically coupled to a magnetization and demagnetization cycle enables the use of larger quantities of magnetocaloric material, and high efficiency solid state cooling can be achieved. Solid state cooling devices are useful for a variety of industrial applications which require cooling, such as, but not limited to cooling of microelectronic devices, cooling on space platforms, etc.

Embodiments of the invention provide a cooling device comprising a hot side, a cold side, at least two thermoelectric layers, at least one magnetocaloric composite, and a magnetic field. In some embodiments, the at least one magnetocaloric composite is positioned in between the at least two thermoelectric layers. In some embodiments, the at least one magnetocaloric composite comprises at least one magnetocaloric material and at least one thermally conductive material with thermal conductivity greater than 75 W/(m K) at the operating temperature of the cooling device, wherein the magnetocaloric material and the thermally conductive material are not the same. In some embodiments, the magnetic field enables the magnetocaloric effect of the magnetocaloric material in the magnetocaloric composite when at least one magnetization and demagnetization cycle is performed, wherein a change in temperature of the magnetocaloric material occurs when the magnetocaloric material is exposed to a changing magnetic field force. In some embodiments, the at least one magnetization and demagnetization cycle comprises increasing the magnetic field force on the magnetocaloric material at a predefined magnetic field ramp-up speed, maintaining the increased magnetic field on the magnetocaloric material for a specified holding time, decreasing the magnetic field force on the magnetocaloric material at a predefined ramp-down speed, and maintaining the decreased magnetic field on the magnetocaloric material for a specified time. In some embodiments, the at least two thermoelectric layers operate separately to move heat from the cold side of the device to the hot side of the device when a DC current is applied in a specified direction, wherein the DC current applied to each thermoelectric layer is electrically coupled to the magnetization and demagnetization cycle of the magnetocaloric material such that one thermoelectric layer operates to allow heat rejection from the magnetocaloric composite to the hot side and one thermoelectric layer operates to allow heat absorption to the magnetocaloric composite from the cold side.

Thermoelectric cooling uses the Peltier effect to create a heat flux between the junction of two different types of materials. A Peltier cooler, heater, or thermoelectric heat pump is a solid-state active heat pump which transfers heat from one side of the device to the other, with consumption of electrical energy, depending on the direction of the current. Such an instrument is also called a Peltier device, Peltier heat pump, solid state refrigerator, or thermoelectric cooler (TEC). It can be used either for heating or for cooling, however the main application is cooling. Good thermoelectric materials are typically heavily doped semiconductors. A single thermoelectric element comprises at least one p-type thermoelectric material and at least on n-type thermoelectric material. FIG. 1 shows a typical thermoelectric module 100 comprising a single thermoelectric element, wherein the thermoelectric element comprises a p-type thermoelectric material 101 and an n-type thermoelectric material 102, wherein copper contacts 103 are used to electrically connect the p-type and n-type materials in series, and wherein the p-type and n-type thermoelectric materials are arranged thermally in parallel in between ceramic substrates 104, and wherein an electric power source 105 applies a DC current 106 in a specified direction to move heat from the cold side of the device to the hot side of the device. For typical thermoelectric modules, the hot side and cold side of the device can be flipped by reversing the direction of the electric current.

There are many possible configurations for the thermoelectric layers. In some embodiments the thermoelectric layers comprise at least one p-type thermoelectric material and at least one n-type thermoelectric material. In some embodiments the thermoelectric materials are in the form of pellets. In some embodiments the thermoelectric pellets may be square, rectangular and/or cylindrical. The size of the thermoelectric pellets may vary depending on the application of the cooling device. In some embodiments the thermoelectric pellets have at least one dimension in the range of about 1 nm to about 1 inch. In some embodiments, the pellets have at least one dimension in the range of about 1 mm to about 1 cm. In some embodiments of the invention the pellets are arranged electrically in series in the thermoelectric layer of the cooling device. In some embodiments, electrically conductive contacts are used to electrically connect the pellets. Any electrically conductive material can be used to electrically connect the thermoelectric pellets. In some embodiments, the electrically conductive contacts are a metal such as copper, tin, nickel, or any combination thereof. In some embodiments, the thermoelectric pellets are arranged thermally in parallel, in between the hot side and cold side of the device. In some embodiments, a non-electrically conductive material is used as a substrate for the thermoelectric pellets. In some embodiments, the hot side and cold side substrate of the thermoelectric layer comprise a ceramic material. In some embodiments of the invention the thermoelectric layer comprises pellets of at least one p-type thermoelectric material and at least one n-type thermoelectric material, and wherein the pellets are arranged electrically in series and thermally in parallel in between the hot side and cold side of the device.

Thermoelectric cooling modules are commercially available in many different sizes. In some embodiments, the thermoelectric layers comprise commercially available thermoelectric cooling modules.

Various thermoelectric materials can be used in the cooling device. Good thermoelectric materials are typically heavily doped semiconductors. Bismuth based alloys are well known in the art as high efficiency thermoelectric materials. In some embodiments, the thermoelectric layers comprise a material selected from the group consisting of bismuth based alloys, lead telluride based alloys, carbon based materials, inorganic clathrate materials, magnesium based materials, silicides, skutterudite materials, oxide materials, Half Heusler alloys, silicon-germanium based materials, sodium-cobaltate based materials, or any combination thereof. In some embodiments, the thermoelectric material further comprises a dopant which causes the thermoelectric material to be n-type. In some embodiments, the thermoelectric material further comprises a dopant which causes the thermoelectric material to be p-type.

Thermoelectric modules typically comprise both a p-type thermoelectric material and an n-type thermoelectric material. In some embodiments, the thermoelectric element comprises both p-type (majority charge carrier of holes) and n-type (majority charge carrier of electrons) thermoelectric materials. Often materials are doped with various dopants to increase thermoelectric properties and/or improve the majority charge carrier of the material, i.e. either the p-type (hole carrier) or n-type (electron carrier) of the material. In some embodiments, the thermoelectric material comprises a dopant which causes the thermoelectric material to be p-type. In some embodiments, the thermoelectric material comprises a dopant which causes the thermoelectric material to be n-type. In some embodiments, both the p-type and n-type thermoelectric material comprise a bismuth based alloy. In some embodiments, the p-type thermoelectric material comprises BiSbTe, BiSb, BiTe, or any combination thereof. In some embodiments, the n-type thermoelectric material comprises BiSeTe, BiSe, TeSe, or any combination thereof. In some embodiments, both the p-type and n-type thermoelectric material comprise a carbon based material. In some embodiments, the p-type thermoelectric material comprises boron doped carbon nanotubes, doped nanodiamond, doped graphene, or any combination thereof. In some embodiments, the n-type thermoelectric material comprises nitrogen doped carbon nanotubes, doped nanodiamond, doped graphene, or any combination thereof.

The thermoelectric properties of materials are typically characterized by a dimensionless parameter known as the figure of merit, ZT, where T is the absolute temperature, and Z is given as $Z=S^2\sigma/\kappa$, where S is the Seebeck coefficient, $\sigma$ is the electrical conductivity, and $\kappa$ is the thermal conductivity. The higher the ZT the better the efficiency. There are several bismuth based alloys that have ZT values near 1 at room temperature.

The thermoelectric material in the cooling device may vary depending on the application in which the particular cooling device is used. The efficiency of thermoelectric materials varies depending on the temperature of operation. Therefore cooling devices which will be used at room temperature may use thermoelectric materials that exhibit high efficiency (high ZT) at room temperature. For some applications, the cooling device may be required to function at low temperatures. For some applications, the cooling device may be required to function at high temperatures. In some embodiments, the cooling device is used for space applications, wherein the cooling device is required to function at low temperatures. In some embodiments, the cooling device is used for cooling electronics at room temperature, wherein the cooling device is required to function at room temperature. In some embodiments, the cooling device is used for cooling at high temperature, wherein the cooling device is required to function at high temperatures. In some embodiments, the thermoelectric materials in the thermoelectric element exhibit thermoelectric properties at or near room temperature. In some embodiments, the thermoelectric materials in the thermoelectric element exhibit thermoelectric properties at any temperature in the range of about 1K to about 2000K. In some embodiments, the thermoelectric materials in the thermoelectric element exhibit thermoelectric properties at any temperature in the range of about 1K to about 40K. In some embodiments, the thermoelectric materials in the thermoelectric element exhibit thermoelectric properties at any temperature in the range of about 30K to about 100K. In some embodiments, the thermoelectric materials in the thermoelectric element exhibit thermoelectric properties at any temperature in the range of about 50K to about 150K. In some embodiments, the thermoelectric materials in the thermoelectric element exhibit thermoelectric properties at any temperature in the range of about 100K to about 200K. In some embodiments, the thermoelectric materials in the thermoelectric element exhibit thermoelectric properties at any temperature in the range of about 80K to about 180K. In some embodiments, the thermoelectric materials in the thermoelectric element exhibit thermoelectric properties at any temperature in the range of about 150K to about 250K. In some embodiments, the thermoelectric materials in the thermoelectric element exhibit thermoelectric properties at any temperature in the range of about 200K to about 300K. In some embodiments, the thermoelectric materials in the thermoelectric element exhibit thermoelectric properties at any temperature in the range of about 250K to about 400K. In some embodiments, the thermoelectric materials in the thermoelectric element exhibit thermoelectric properties at any temperature in the range of about 350K to about 500K. In some embodiments, the thermoelectric materials in the thermoelectric element exhibit thermoelectric properties at any temperature in the range of about 450K to about 1000K. In some embodiments, the thermoelectric materials in the thermoelectric element exhibit thermoelectric properties at any temperature in the range of about 1000K to about 2000K. In some embodiments, low temperature thermoelectric materials are used in the thermoelectric element, which are selected from the group consisting of doped or un-doped BiSbTe alloys, doped or un-doped BiSbTeSe alloys, doped or un-doped CsBiTe alloys, doped or un-doped KBiS alloys, doped or un-doped KBiSe alloys, doped or un-doped BiTe alloys, doped or un-doped BiSb alloys, doped or un-doped SbTe alloys, doped or un-doped BiSeTe alloys, doped or un-doped CsBiSbTe alloys, doped or un-doped CsBiTeSe alloys, doped or un-doped CsRbBiTe alloys, or any combination thereof. In some embodiments, room temperature thermoelectric materials are used in the thermoelectric element, which are selected from the group consisting of doped or un-doped BiSbTe alloys, doped or un-doped BiSbTeSe alloys, doped or un-doped BiTe alloys, doped or un-doped BiSe alloys, doped or un-doped SbSe alloys, doped or un-doped BiTe alloys, doped or un-doped SbTe alloys, doped or un-doped BiSeTe alloys, doped or un-doped SiGe alloys, doped or un-doped YbAgCu$_4$ alloys, or any combination thereof. In some embodiments, the thermoelectric material may further comprise a dopant selected from the group consisting of N, B, K, S, InTe alloys, Sb, Se, Te, SbI alloys, or any combination thereof.

Various methods may be used to synthesize the thermoelectric pellets of the thermoelectric element. In some embodiments, the thermoelectric pellets comprise nanomaterials. P. K. Nguyen, K. H. Lee, J. Moon, S. I. Kim, K. A. Ahn, L. H. Chen, S. M. Lee, R. K. Chen, S. Jin, and A. E. Berkowitz, *Nanotechnology,* 23, 415604 (2012) showed that nanomaterials may have significantly improved efficiency ZT compared to their bulk counterparts because small particles/small grains have huge interfacial area, which scatters phonons and reduces lattice thermal conductivity. In some embodiments, the thermoelectric pellets comprise at least one nano-grained material, wherein the nano-grained material has at least one of its dimensions in the range of about 1 nm to about 100 nm. In some embodiments, a nano-grained thermoelectric material may be synthesized using various methods known in the art, such as, but not limited to, spark erosion, chemical precipitation, hydrothermal method, arc melting, chemical vapor deposition, physical vapor deposition, ball-milling, etc. In some embodiments, the nano-grained material is formed into a pellet structure by various methods known in the art, such as sintering, hydraulic pressing, swaging, hot pressing, or any other method which effectively packs powder material into solid pellet form. In some embodiments, the thermoelectric pellets will be soldered to electrical contacts and/or a ceramic substrate to form a thermoelectric element, and therefore, the pellet structure of the nano-grained material must be strong enough to withstand soldering temperatures and processing. In some embodiments, the pellet structure must also be strong enough to withstand the temperature cycles of the cooling device, wherein the various materials and components of the cooling device may expand and/or contract as the temperature of the device changes during its operation.

R. Wolfe and G. E. Smith, *Appl. Phys. Lett.* 1, 5 (1962), showed that the cooling efficiency of a single-crystal Bi$_{0.88}$Sb$_{0.12}$ alloy increases by ~2.8 times in the presence of a magnetic field. Since then, there has been a handful of studies characterizing the enhancement of thermoelectric efficiency under magnetic field, most of which are for Bismuth antimony alloys. These studies are disclosed in C.

B. Thomast and H. J. Goldsmid, *Journal of Physics D: Applied Physics*, 3 (1970), T. Aono, *Japanese Journal of Applied Physics*, 9 (7) (1970), and W. M. Yim and A. Amith, *Solid-State Electronics*, 15, 1141 (1972).

Figure 2:
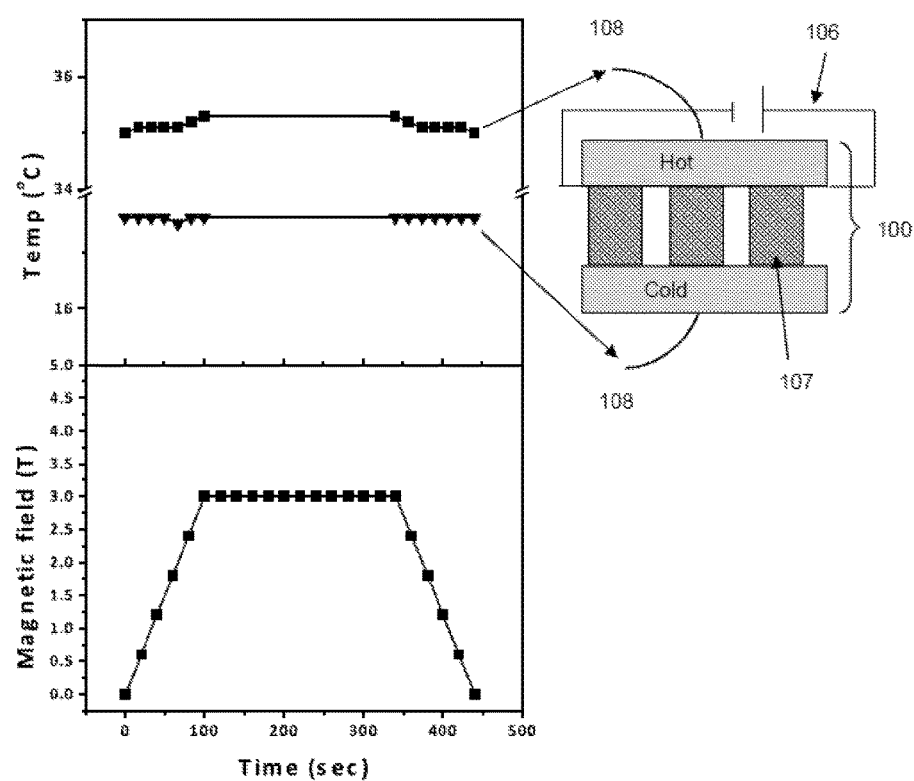
FIG. 2 shows the change in the hot side and cold side temperature of a commercially available thermoelectric module during a single oscillation cycle of a magnetic field in vacuum at 300K.

FIG. 2 shows the temperature versus time of a commercially available thermoelectric module 101 (purchased from Custom Thermoelectrics, Inc.) wherein a 6 W electric current 106 is applied to the device, wherein the device is under vacuum, and wherein the thermoelectric pellets 107 comprise a bismuth telluride material, and wherein thermocouples 108 are attached to the hot side and cold side of the device, and wherein a 3.0 Tesla magnetic field is applied to the device and the hot side temperature of the device increases by 0.3 C, indicating the application of the magnetic field affects the heat flux of the thermoelectric module.

The enhanced thermoelectric properties with magnetic field vary widely throughout the literature due to composition, differences in doping concentrations, even directional solidification and texturing may have significant effects on these materials thermoelectric, and magneto-thermoelectric properties. Depending on the thermoelectric materials that are used in the cooling device, the thermoelectric efficiency may or may not be enhanced in the presence of a magnetic field. In some embodiments, the efficiency of the thermoelectric material is enhanced with application of a magnetic field. In some embodiments, the magnitude of the magnetic field affects the efficiency of the thermoelectric material. In some embodiments, the ZT of the thermoelectric material is increased by a factor of between about 0.01 to about 5.0 when in the presence of a magnetic field of magnitude greater than 0.2 Tesla. In some embodiments, the ZT of the thermoelectric material is increased by a factor of between about 0.05 to about 3.0 when in the presence of a magnetic field of magnitude greater than 0.2 Tesla. In some embodiments, the ZT of the thermoelectric material is increased by a factor of between about 0.1 to about 1.0 when in the presence of a magnetic field of magnitude greater than 0.2 Tesla. In some embodiments, the ZT of the thermoelectric material is increased by a factor of between about 0.01 to about 0.05 when in the presence of a magnetic field of magnitude greater than 0.2 Tesla. In some embodiments, the ZT of the thermoelectric material is increased by a factor of between about 0.01 to about 0.1 when in the presence of a magnetic field of magnitude greater than 0.2 Tesla. In some embodiments, the ZT of the thermoelectric material is increased by a factor of greater than about 0.01, when in the presence of a magnetic field at any magnitude in the range of about 0.01 Tesla to about 10 Tesla. In some embodiments, the ZT of the thermoelectric material is increased by a factor of greater than about 0.01, when in the presence of a magnetic field at any magnitude in the range of about 0.2 Tesla to about 3 Tesla. In some embodiments, the ZT of the thermoelectric material is increased by a factor of greater than about 0.01, when in the presence of a magnetic field at any magnitude in the range of about 0.4 Tesla to about 2 Tesla.

Iron is easily magnetized when a magnetic field is applied and may act to locally amplify a magnetic field. R. D. McMichael, J. J. Ritter, and R. D. Shull, *J. Appl. Phys.*, 73, (10) 6946 (1993), showed that the addition of iron nanoparticles to gadolinium-gallium composites increases the magnetocaloric response by a factor of 3-4, which may be due to a local field amplification effect. Therefore, incorporation of iron and/or its composites into the thermoelectric materials may act to locally amplify the magnetic field in the composite, and further enhance the efficiency of the material. In some embodiments, the thermoelectric material further comprises iron or any material, composite, or alloy comprising iron. In some embodiments the thermoelectric material comprises nanoparticles of iron or nanoparticles of any material, composite, or alloy comprising iron. In some embodiments, the thermoelectric pellets further comprise iron or any material, composite, or alloy comprising iron.

The magnetocaloric effect (MCE) is a phenomenon in which the temperature change of a suitable material is caused by exposing the material to a changing magnetic field. The magnetocaloric effect can be quantified with the equation below:

$$\Delta T_{ad} = -\int_{H_0}^{H_1} \left(\frac{T}{C(T,H)}\right)_H \left(\frac{\partial M(T,H)}{\partial T}\right)_H dH$$

where T is the temperature, H is the applied magnetic field, C is the heat capacity of the working magnet (refrigerant) and M is the magnetization of the refrigerant. The temperature change in the material is caused by a change in the entropy of the material.

In some embodiments the magnetic field enables the magnetocaloric effect of the magnetocaloric material when at least one magnetization and demagnetization cycle is performed by a mechanical movement system, wherein a change in temperature of the magnetocaloric material occurs when the magnetocaloric material is moved into or out of a magnetic field. In some embodiments, the magnetization and demagnetization cycle is performed by increasing the magnetic field force and then decreasing the magnetic field force. It is the object of the invention to utilize the cooling from the magnetocaloric material to create a solid state cooling device.

As used herein, the term "magnetocaloric effect" includes any phenomenon in which the temperature change of a material is caused by exposing the material to a changing magnetic field.

The magnetocaloric effect exhibited by most magnetocaloric materials is as follows: the temperature of the magnetocaloric material increases when the magnetic field is moved near or in contact with the magnetocaloric material, and wherein the temperature of the magnetocaloric material decreases when the magnetic field is moved away from the magnetocaloric material. Materials which undergo a magnetocaloric effect with application and removal of a magnetic field include, but are not limited to, Gadolinium based alloys. In some embodiments, the magnetocaloric material exhibits a magnetocaloric effect, wherein the temperature of the magnetocaloric material increases when the magnetic field is moved near or in contact with the magnetocaloric material, and wherein the temperature of the magnetocaloric material decreases when the magnetic field is moved away from the magnetocaloric material. In some embodiments, the magnetocaloric material comprises a Gd based alloy. In some embodiments, the magnetocaloric material comprises a Dy based alloy.

However, some magnetocaloric materials exhibit an inverse magnetocaloric effect, wherein the temperature of the magnetocaloric material decreases when the magnetic field is moved near or in contact with the magnetocaloric material, and wherein the temperature of the magnetocaloric material increases when the magnetic field is moved away from the magnetocaloric material. Materials which undergo an inverse magnetocaloric effect with application and removal of a magnetic field include, but are not limited to, Heusler alloys, which include, but are not limited to, NiMn based alloys. In some embodiments, the magnetocaloric material exhibits an inverse magnetocaloric effect, wherein the temperature of the magnetocaloric material decreases when the magnetic field is moved near or in contact with the magnetocaloric material, and wherein the temperature of the magnetocaloric material increases when the magnetic field is moved away from the magnetocaloric material. In some embodiments, the magnetocaloric material is a NiMn based alloy.

Figure 3:
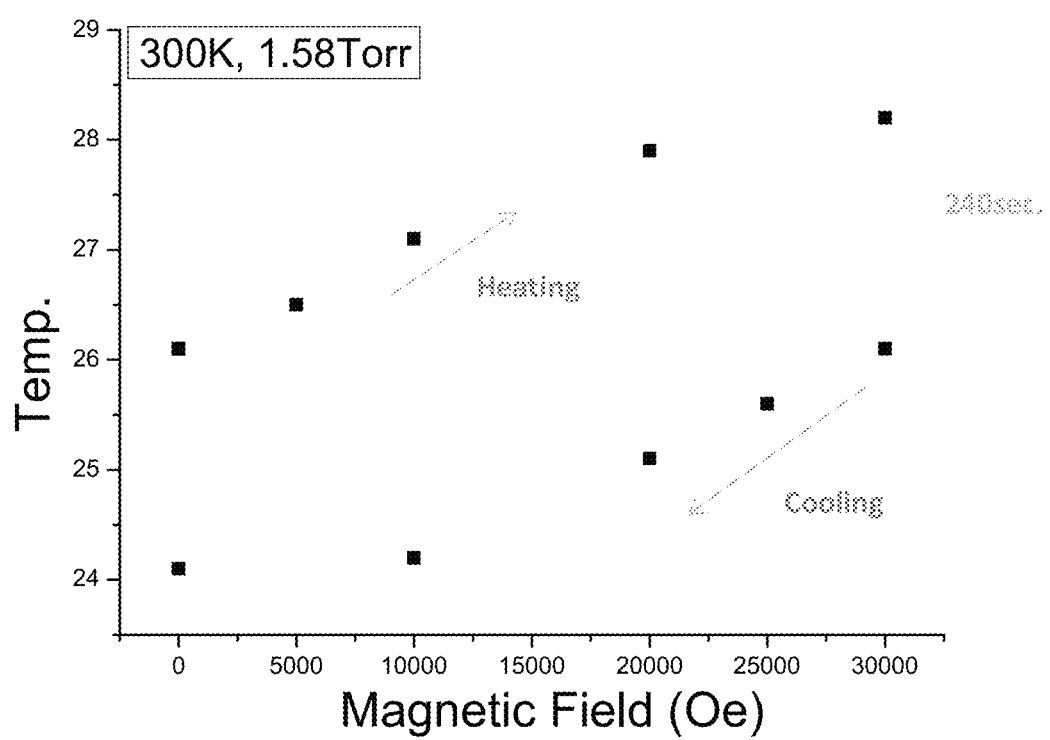
FIG. 3 shows the temperature versus magnetic field during a single oscillation cycle of a pure Gd plate in vacuum at 300K.

FIG. 3 shows the temperature versus magnetic field during a single oscillation cycle of a pure Gd plate in vacuum at 300K, wherein the initial temperature of the Gd plate is 26 C, and wherein as the magnetic field increases to ~3 Tesla, the temperature of the Gd plate increases to 28 C, and wherein the heat dissipates and the temperature of the Gd plate returns to 26 C while holding the magnetic field at ~3 Tesla for 240 seconds, and wherein the magnetic field is removed and the temperature of the Gd plate decreases to 24 C. In some embodiments of the cooling device, the magnetic field enables the magnetocaloric effect of the magnetocaloric material when at least one magnetization and demagnetization cycle is performed, wherein a change in temperature of the magnetocaloric material occurs when the magnetocaloric material is moved into or out of a magnetic field. In some embodiments, the magnetization and demagnetization cycle occurs when the magnetic field force applied to the magnetocaloric material changes from about 0 T to about 0.3 T then from about 0.3 T to about 0 T. In some embodiments, the magnetization and demagnetization cycle occurs when the magnetic field force applied to the magnetocaloric material changes from about 0 T to about 0.5 T then from about 0.5 T to about 0 T. In some embodiments, the magnetization and demagnetization cycle occurs when the magnetic field force applied to the magnetocaloric material changes from about 0 T to about 0.7 T then from about 0.7 T to about 0 T. In some embodiments, the magnetization and demagnetization cycle occurs when the magnetic field force applied to the magnetocaloric material changes from about 0 T to about 1 T then from about 1 T to about 0 T. In some embodiments, the magnetization and demagnetization cycle occurs when the magnetic field force applied to the magnetocaloric material changes from about 0 T to greater than about 1 T then from greater than about 1 T to about 0 T. In some embodiments of the cooling device, the magnetic field enables the magnetocaloric effect of the magnetocaloric material when at least one magnetization and demagnetization cycle is performed, wherein a change in temperature of the magnetocaloric material occurs when the magnetocaloric material is exposed to a changing magnetic field force. In some embodiments, the magnetization and demagnetization cycle occurs when the magnetic field force applied to the magnetocaloric material changes from about 1 T to about 3 T then from about 3 T to about 1 T. In some embodiments, the magnetization and demagnetization cycle occurs when the magnetic field force applied to the magnetocaloric material changes from about 3 T to about 10 T then from about 10 T to about 3 T. In some embodiments, the magnetization and demagnetization cycle occurs when the magnetic field force applied to the magnetocaloric material changes from less than about 3 T to greater than about 6 T then from greater than about 6 T to less than about 3 T. In some embodiments, the magnetization and demagnetization cycle occurs when the magnetic field force applied to the magnetocaloric material changes from less than about 6 T to greater than about 10 T then from greater than about 10 T to less than about 6 T.

Various magnetocaloric materials may be used in the cooling device. Magnetocaloric materials have been around for decades and are typically used to provide cooling at cryogenic temperatures (<1K). Several magnetic refrigerators for cryogenic applications are commercially available. Similar to thermoelectric materials, magnetocaloric materials only exhibit a magnetocaloric response in a specific temperature range. Therefore, depending on the application of the cooling device, an adequate magnetocaloric material must be used in the cooling device. In some embodiments, the magnetocaloric material is selected from the group consisting of Gd, Gd based alloy's, NiMn based alloys, La based alloys, Nd based alloys, Dy based alloys, Pr based alloys, MnAs based alloys, Er based alloys, Tm based alloys, FeNi based alloys, or any combination thereof.

In some embodiments the cooling device is designed for low temperature applications, wherein the magnetocaloric material of the device comprises a material which exhibits a magnetocaloric effect at low temperature. In some embodiments the cooling device is designed for room temperature applications, wherein the magnetocaloric material of the device comprises a material which exhibits magnetocaloric effect at room temperature. In some embodiments the cooling device is designed for high temperature applications, wherein the magnetocaloric material of the device comprises a material which exhibits magnetocaloric effect at high temperature. In some embodiments, the magnetocaloric material in the cooling device exhibits a magnetocaloric effect at any temperature in the range of about 1K to about 2000K. In some embodiments, the magnetocaloric material in the cooling device exhibits a magnetocaloric effect at any temperature in the range of about 1K to about 40K. In some embodiments, the magnetocaloric material in the cooling device exhibits a magnetocaloric effect at any temperature in the range of about 30K to about 100K. In some embodiments, the magnetocaloric material in the cooling device exhibits a magnetocaloric effect at any temperature in the range of about 50K to about 150K. In some embodiments, the magnetocaloric material in the cooling device exhibits a magnetocaloric effect at any temperature in the range of about 100K to about 200K. In some embodiments, the magnetocaloric material in the cooling device exhibits a magnetocaloric effect at any temperature in the range of about 80K to about 180K. In some embodiments, the magnetocaloric material in the cooling device exhibits a magnetocaloric effect at any temperature in the range of about 150K to about 250K. In some embodiments, the magnetocaloric material in the cooling device exhibits a magnetocaloric effect at any temperature in the range of about 200K to about 300K. In some embodiments, the magnetocaloric material in the cooling device exhibits a magnetocaloric effect at any temperature in the range of about 250K to about 400K. In some embodiments, the magnetocaloric material in the cooling device exhibits a magnetocaloric effect at any temperature in the range of about 350K to about 500K. In some embodiments, the magnetocaloric material in the cooling device exhibits a magnetocaloric effect at any temperature in the range of about 450K to about 1000K. In some embodiments, the magnetocaloric material in the cooling device exhibits a magnetocaloric effect at any temperature in the range of about 1000K to about 2000K.

Various magnetocaloric materials are available and can be used in the cooling device. In some embodiments the magnetocaloric material is selected from the group consisting of Gd, GdSiGe alloys, GdSiGeFe alloys, GdGeSiSn alloys, GdGa alloys, GdGaFe alloys, GdPd alloys, NiMnSn alloys, NiMnGa alloys, FeNiMn alloys, FeNiB alloys, FeNiZrB alloys, NiMnIn alloys, NiMnInCo alloys, NiMnCuGa alloys, NiMnSb alloys, NiMnCoSn alloys, NiCoMnIn alloys, FeNi alloys, FeNiCo alloys, LaFe alloys, LaSi alloys, LaAl alloys, LaNiSi alloys, CeNiSi alloys, PrNiSi alloys, NdNiSi alloys, GdGaO alloys, DyAlO alloys, NdFe alloys, NdGaO alloys, NdAlO alloys, GdGaO alloys, GdAlO alloys, Dy GaO alloys, DyAlO alloys, Pr, Nd, ErAl alloys, HoAl alloys, DyAl alloys, DyHoAl alloys, DyErAl alloys, GdPdAl alloys, GdFeAl alloys, GdNi alloys, GdBiSn alloys, DyNi alloys, HoNi alloys, PrCoSi alloys, GdCoSi alloys, LaCoSi alloys, LaCaMnO alloys, LaFeSi alloys, MnAs alloys, MnGe alloys, MnCuAs alloys, MnAsSb alloys, MnFePAs alloys, MnAsFe alloys, MnFePGe alloys, LaFeAl alloys, LaFeCoSi alloys, LaPrFeCoSi alloys, LaPrFeSi alloys, LaFeMnSi alloys, LaNdFeSi alloys, LaCeFeSi alloys, LaPrFeSi alloys, LaFeSiH alloys, LaFeMnSiH alloys, LaFeSiC alloys, LaNdFeCoSi alloys, LaFeCoAl alloys, CdCrS alloys, CdCuCrS alloys, CdFeCrS alloys, CeFeMnB alloys, or any combination thereof.

In some embodiments, the magnetocaloric response of the magnetocaloric material may be broadened (temperature span of magnetocaloric response) or enhanced (magnitude of magnetocaloric response) by decreasing the grain size in the material. In some embodiments, the magnetocaloric material comprises at least one nano-grained material, wherein the nano-grained material has at least one of its dimensions in the range of about 1 nm to about 100 nm. In some embodiments, the nanograins of the magnetocaloric material are synthesized by methods known in the art, such as, but not limited to, spark erosion, ball milling, hydrothermal method, chemical precipitation synthesis, arc melting, chemical vapor deposition, physical vapor deposition, etc. In some embodiments, the nano-grained magnetocaloric material is formed into a layered or pellet structure by various methods known in the art, such as sintering, hydraulic pressing, swaging, hot pressing, or any other method which effectively packs powder material into solid pellet form.

R. D. McMichael, J. J. Ritter, and R. D. Shull, *J. Appl. Phys.*, 73, (10) 6946 (1993), showed that the addition of iron nanoparticles to gadolinium-gallium composites increases the magnetocaloric response by a factor of 3-4, which may be due to a local field amplification effect. Therefore, incorporation of iron and/or its composites into the magnetocaloric material may act to locally amplify the magnetic field in the material, and further enhance the magnetocaloric response of the material. In some embodiments, the magnetocaloric material further comprises iron or any material, composite, or alloy comprising iron. In some embodiments the magnetocaloric material comprises nanoparticles of iron or nanoparticles of any material, composite, or alloy comprising iron. In some embodiments, the magnetocaloric pellets further comprise iron or any material, composite, or alloy comprising iron.

A key feature of the disclosed invention is the use of a magnetocaloric composite. Various forms of the magnetocaloric composite are possible. In some embodiments, the magnetocaloric composite comprises a thermally conductive matrix, wherein the magnetocaloric material is dispersed homogenously throughout the thermally conductive matrix. In some embodiments, the magnetocaloric composite comprises alternating layers of magnetocaloric material and thermally conductive material. In some embodiments, the alternating layers of magnetocaloric material and thermally conductive material are perpendicular to the direction of heat flow in the cooling device. In some embodiments, the alternating layers of magnetocaloric material and thermally conductive material are parallel to the direction of heat flow in the cooling device. In some embodiments, more than one thermally conductive material is used in the magnetocaloric composite. In some embodiments, thermally conductive adhesives may be used to adhere the thermally conductive material(s) to the magnetocaloric material. In some embodiments, the thickness of at least one of the layers of magnetocaloric material within the magnetocaloric composite is between about 10 nm and 5 mm. In some embodiments, the thickness of at least one of the layers of magnetocaloric material within the magnetocaloric composite is between about 100 nm and 5 mm. In some embodiments, the thickness of at least one of the layers of magnetocaloric material within the magnetocaloric composite is between about 100 nm and 2 mm. In some embodiments, the thickness of at least one of the layers of magnetocaloric material within the magnetocaloric composite is between about 1000 nm and 2 mm. In some embodiments, the thickness of at least one of the layers of magnetocaloric material within the magnetocaloric composite is between about 1000 nm and 1 mm. In some embodiments, the thickness of at least one of the layers of magnetocaloric material within the magnetocaloric composite is between about 10 um and 2 mm. In some embodiments, the thickness of at least one of the layers of thermally conductive material is between about 10 nm and about 5 mm. In some embodiments, the thickness of at least one of the layers of thermally conductive material is between about 10 nm and about 1 mm. In some embodiments, the thickness of at least one of the layers of thermally conductive material is between about 100 nm and about 5 mm. In some embodiments, the thickness of at least one of the layers of thermally conductive material is between about 100 nm and about 2 mm. In some embodiments, the thickness of at least one of the layers of thermally conductive material is between about 1000 nm and about 5 mm. In some embodiments, the thickness of at least one of the layers of thermally conductive material is between about 1000 nm and about 1 mm. In some embodiments, the thickness of at least one of the layers of thermally conductive material is between about 10 um and about 5 mm. In some embodiments, the thickness of at least one of the layers of thermally conductive material is between about 10 um and about 2 mm. In some embodiments, the thickness of at least one of the layers of thermally conductive material is between about 10 um and about 1 mm. In some embodiments, the thickness of at least one of the layers of thermally conductive material is between about 10 um and about 500 um.

Various thermally conductive materials can be used in the cooling device. In some embodiments, the thermally conductive material comprises a metal. In some embodiments, the thermally conductive material is selected from the group consisting of copper, aluminum, diamond, gold, silver, brass, steel, graphene, graphite, iron, lead, nickel, tin, tungsten, zinc, or any combination thereof. In some embodiments, the thermally conductive material has a thermal conductivity greater than 25 W/(m K). In some embodiments, the thermally conductive material has a thermal conductivity greater than 50 W/(m K). In some embodiments, the thermally conductive material has a thermal conductivity greater than 75 W/(m K). In some embodiments, the thermally conductive material has a thermal conductivity greater than 100 W/(m K). In some embodiments, the thermally conductive material has a thermal conductivity greater than 200 W/(m K). In some embodiments, the thermally conductive material comprises copper. In some embodiments, the thermally conductive material has a thermal conductivity greater than 300 W/(m K).

In some embodiments, a mechanical movement system is utilized to perform the at least one magnetization and demagnetization cycle. In some embodiments the mechanical movement system performs the at least one magnetization and demagnetization cycle by physically moving a magnet, the magnetocaloric material, a magnetic shielding material, or any combination thereof. In some embodiments, the mechanical movement system is designed to perform multiple magnetization and demagnetization cycles. In some embodiments the mechanical movement system is a linear system. In some embodiments the mechanical movement system is a rotational system. In some embodiments, the cooling device has both a linear and rotational mechanical movement system. In some embodiments, the mechanical movement system linearly moves the cooling device, wherein the linear movement of the cooling device acts to move the magnetocaloric material into and out of the magnetic field. In some embodiments, the mechanical movement system linearly moves a permanent magnet, wherein the linear movement of the permanent magnet acts to move the magnetocaloric material into and out of the magnetic field. In some embodiments, the mechanical movement system linearly moves a magnetic shielding material, such that the magnetic field and the cooling device are stationary, wherein the magnetic shielding material acts to block the magnetic field from the cooling device when positioned appropriately, and when the magnetic shielding material is moved the magnetic field is applied to the cooling device. In some embodiments, the mechanical movement system rotates the permanent magnet or magnets, wherein the rotation of the magnet or magnets acts to oscillate the magnetic field force within the device.

Various mechanical systems may be used as the mechanical movement system. In some embodiments, electronic linear actuators are used to linearly move the permanent magnet or magnets, magnetic shielding materials, or the cooling device, or any combination thereof. In some embodiments, an electronic rotational actuator is used to linearly move the permanent magnet or magnets, magnetic shielding materials, or the cooling device, or any combination thereof. The size and number of actuators needed depends on the device structure. Various methods may be used to mount the material to be moved to a frame or substrate, wherein a single actuator then moves the entire substrate with the material or materials mounted on it. The chosen mechanical movement system must be compatible with the magnetic field generated by the magnets. The mechanical movement system must also be strong enough to perform the at least one magnetization and demagnetization cycle with the fluctuations of the magnetic field, and the tendency of the magnets along with the magentocaloric materials to attract and repel from each other, and/or other materials within the device. In some embodiments, the magnets, the cooling device, the magnetic shielding materials, and/or any combination are mounted on substrates or frame materials using a method that is strong enough to hold the materials in place during the at least one magnetization and demagnetization cycle.

The magnetic field of the permanent magnet is strongest at the surface of the permanent magnet and decreases with distance from the magnet. The distance required for the mechanical movement system to move the magnetic field towards and away from the magnetic field depends on the magnitude of the magnetic field produced by the permanent magnet, which will also vary depending on the size and material type of the permanent magnet. Maximizing the change in the magnitude of the magnetic field will maximize the magnetocaloric response of the magnetocaloric material. In order to increase the change in temperature of the magnetocaloric material, in some embodiments, it is desirable for the mechanical movement system to apply a magnetic field of greater than about 0.01 Tesla, greater than about 0.1 Tesla, greater than about 0.2 Tesla, greater than about 0.4 Tesla, greater than about 0.6 Tesla, greater than about 0.8 Tesla, or greater than about 1 Tesla. In order to increase the change in temperature of the magnetocaloric materials, in some embodiments, it is desirable for the mechanical movement system to remove the magnetic field so that the magnitude of the magnetic field on the magnetocaloric material is less than about 0.2 Tesla, less than about 0.1 Tesla, less than about 0.05 Tesla, less than about 0.02 Tesla, less than about 0.01 Tesla, or less than about 0.001 Tesla.

In some embodiments the at least one magnetization and demagnetization cycle comprises applying the magnetic field on the magnetocaloric material at a predefined magnetic field ramp-up speed, holding the magnetic field on the magnetocaloric material for a specified contact holding time, removing the magnetic field from the magnetocaloric material at a predefined ramp-down speed, and maintaining zero magnetic field on the magnetocaloric material for a specified removed holding time. In some embodiments, the magnetic field is applied on the magnetocaloric material during the at least one magnetization and demagnetization cycle at a magnetic field ramp-up speed of between about 0.001 Tesla per second to about 9 Tesla per second. In some embodiments, the holding time of the magnetic field during the at least one magnetization and demagnetization cycle is between about 0.01 seconds to about 10 minutes. In some embodiments, the magnetic field is removed from the magnetocaloric material during the at least one magnetization and demagnetization cycle at a magnetic field ramp-down speed of between about 9 Tesla per second to about 0.001 Tesla per second. In some embodiments, the removed holding time of the magnetic field during the at least one magnetization and demagnetization cycle is between about 0.01 seconds to about 10 minutes.

The cooling device must be powered by at least one electrical power source. The thermoelectric layers require separate DC currents to be applied in a specified direction, and at a specified time during the magnetization and demagnetization cycle. In some embodiments, the direction of the DC current can be reversed from the specified direction, to move heat in the opposite direction.

It is the object of the invention to provide a solid state cooling device which utilizes the magnetocaloric material and at least two thermoelectric modules.

Figure 4:
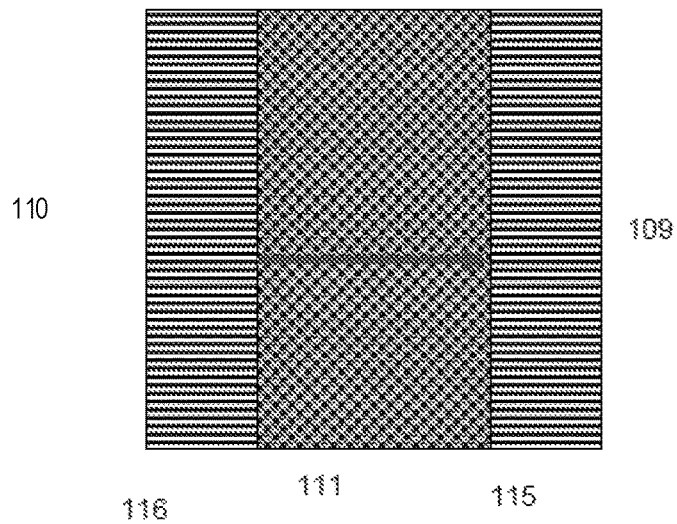
FIG. 4 illustrates an embodiment of a cooling device comprising a hot side, a cold side, at least two thermoelectric layers, at least one magnetocaloric composite, and a magnetic field, wherein the at least one magnetocaloric composite is positioned in between the at least two thermoelectric layers.
Figure 4:
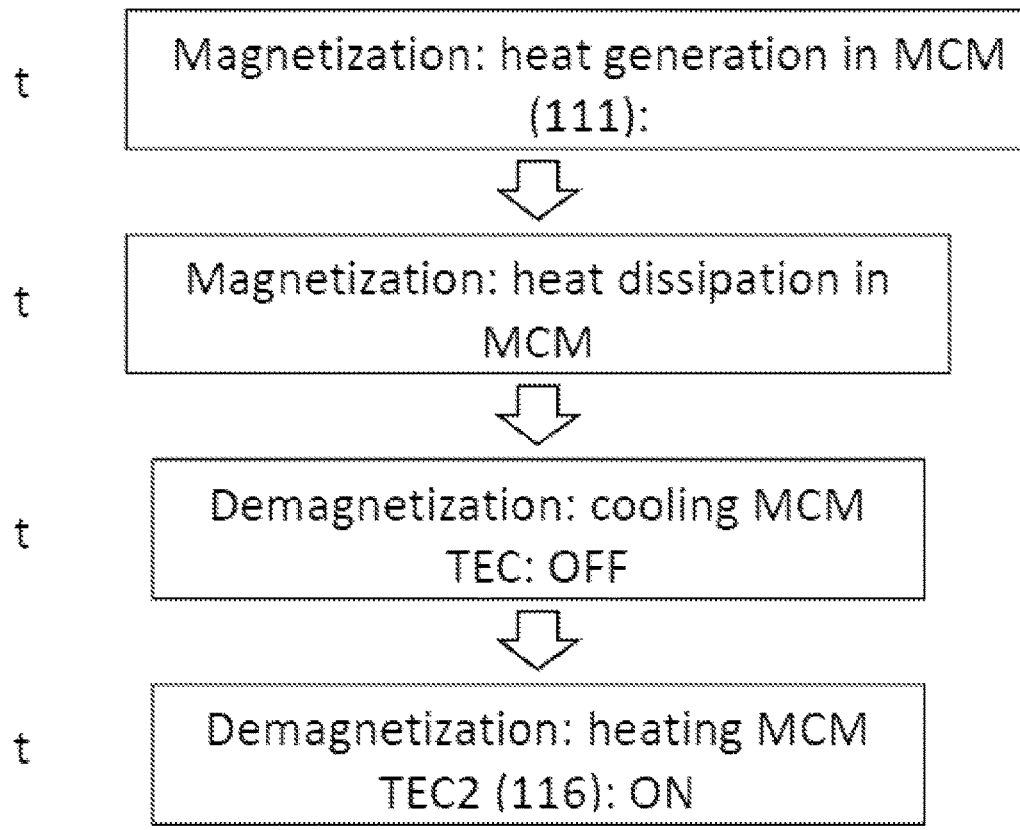

FIG. 4 illustrates an embodiment of a cooling device comprising a hot side 109, a cold side 110, at least two thermoelectric layers, at least one magnetocaloric composite 111, and a magnetic field 112, wherein the at least one magnetocaloric composite is positioned in between the at least two thermoelectric layers, and wherein the at least one magnetocaloric composite comprises at least one magnetocaloric material 113 and at least one thermally conductive material 114 with thermal conductivity greater than 75 W/(m K) at the operating temperature of the cooling device, wherein the magnetocaloric material and the thermally conductive material are not the same, and wherein the magnetic field enables the magnetocaloric effect of the magnetocaloric material in the magnetocaloric composite when at least one magnetization and demagnetization cycle is performed, wherein the at least one magnetization and demagnetization cycle comprises magnetizing the magnetocaloric material at a predefined magnetic field ramp-up speed and then the magnetic field is maintained on the magnetocaloric material for a specified holding time, wherein the hot side thermoelectric layer (TEC1) 115 is turned on to allow heat rejection from the magnetocaloric composite, then the magnetocaloric material is demagnetized at a predefined ramp-down speed and zero magnetic field is maintained on the magnetocaloric material for a specified removed time, wherein the cold side thermoelectric layer (TEC2) 116 is turned on to allow heat absorption to the magnetocaloric composite from the cold side.

FIG. 4 also describes an embodiment of the magnetization and demagnetization cycle comprising four steps. In the first step, the magnetic field is applied to the device and the magnetocaloric material increases in temperature. In the second step while the magnetic field is applied to the device, one of the thermoelectric layers is turned on (TEC1) 115, and heat is rejected from the magnetocaloric composite. Once the magnetocaloric material returns to its original temperature, the thermoelectric layer (TEC1) 115 is turned off. In the third step, the magnetic field is removed causing the magnetocaloric material to cool. In the fourth step, the other thermoelectric layer (TEC2) 116 is turned on and heat is absorbed into the magnetocaloric composite. Once the temperature of the magnetocaloric composite returns to its original temperature, the thermoelectric layer (TEC2) 116 is turned off. The four step cycle is then repeated to actively move heat.

Figure 5:
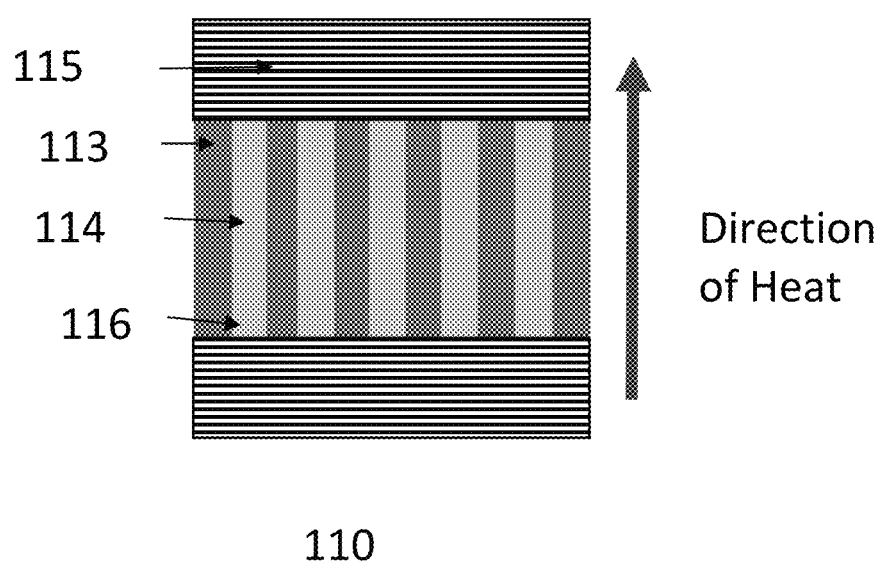
FIG. 5 illustrates an embodiment of a cooling device comprising a hot side, a cold side, at least two thermoelectric layers, at least one magnetocaloric composite, and a magnetic field, wherein the at least one magnetocaloric composite is positioned in between the at least two thermoelectric layers, and wherein the magnetocaloric composite comprises a layered structure.

FIG. 5 illustrates an embodiment of a cooling device comprising a hot side 109, a cold side 110, at least two thermoelectric layers 115 and 116, at least one magnetocaloric composite 111, and a magnetic field 112. The at least one magnetocaloric composite is positioned in between the at least two thermoelectric layers. The at least one magnetocaloric composite comprises at least one magnetocaloric material 113 and at least one thermally conductive material 114 with thermal conductivity greater than 75 W/(m K) at the operating temperature of the cooling device, wherein the magnetocaloric material and the thermally conductive material are not the same. In the magnetocaloric composite, the magnetocaloric material and the thermally conductive material are positioned in alternating layers parallel the heat flow direction. The magnetic field enables the magnetocaloric effect of the magnetocaloric material in the magnetocaloric composite when at least one magnetization and demagnetization cycle is performed, wherein the at least one magnetization and demagnetization cycle comprises magnetizing the magnetocaloric material at a predefined magnetic field ramp-up speed and then the magnetic field is maintained on the magnetocaloric material for a specified holding time, wherein the hot side thermoelectric layer (TEC1) 115 is turned on to allow heat rejection from the magnetocaloric composite, then the magnetocaloric material is demagnetized at a predefined ramp-down speed and zero magnetic field is maintained on the magnetocaloric material for a specified removed time, wherein the cold side thermoelectric layer (TEC2) 116 is turned on to allow heat absorption to the magnetocaloric composite from the cold side.

Figure 6:
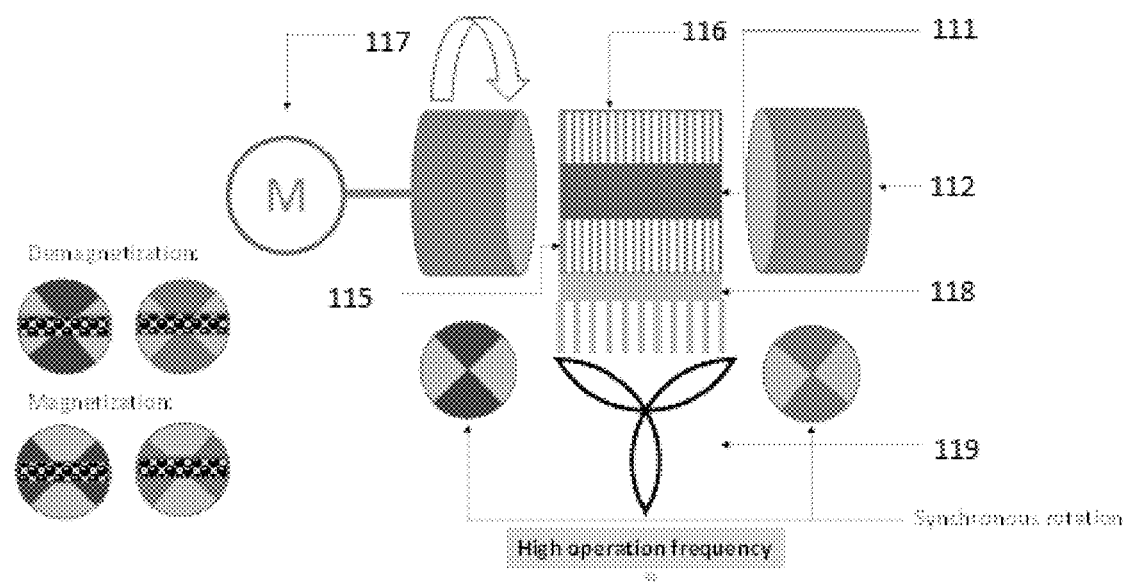
FIG. 6 illustrates an embodiment of a cooling device comprising a hot side, a cold side, at least two thermoelectric layers, at least one magnetocaloric composite, and a magnetic field, wherein the at least one magnetocaloric composite is positioned in between the at least two thermoelectric layers, and wherein the device further comprises a heat sink and convection system.

FIG. 6 illustrates an embodiment of a cooling device comprising a hot side 109, a cold side 110, at least two thermoelectric layers 115 and 116, at least one magnetocaloric composite 111, and a magnetic field 112. The at least one magnetocaloric composite is positioned in between the at least two thermoelectric layers. The at least one magnetocaloric composite comprises at least one magnetocaloric material and at least one thermally conductive material with thermal conductivity greater than 75 W/(m K) at the operating temperature of the cooling device, wherein the magnetocaloric material and the thermally conductive material are not the same. The magnetic field enables the magnetocaloric effect of the magnetocaloric material in the magnetocaloric composite when at least one magnetization and demagnetization cycle is performed. The magnetic field is supplied by a permanent magnets, wherein one of the magnet rotates using a motor 117, wherein the rotation enables the magnetization and demagnetization cycle. The at least one magnetization and demagnetization cycle comprises magnetizing the magnetocaloric material at a predefined magnetic field ramp-up speed and then the magnetic field is maintained on the magnetocaloric material for a specified holding time, wherein the hot side thermoelectric layer (TEC1) 115 is turned on to allow heat rejection from the magnetocaloric composite, then the magnetocaloric material is demagnetized at a predefined ramp-down speed and zero magnetic field is maintained on the magnetocaloric material for a specified removed time, wherein the cold side thermoelectric layer (TEC2) 116 is turned on to allow heat absorption to the magnetocaloric composite from the cold side. The device further comprises a heat sink 118 and a fan 119 to increase heat removal from the device. In this embodiment, the rotating magnet may provide high cycle times for the magnetization and demagnetization cycle.

Figure 7:
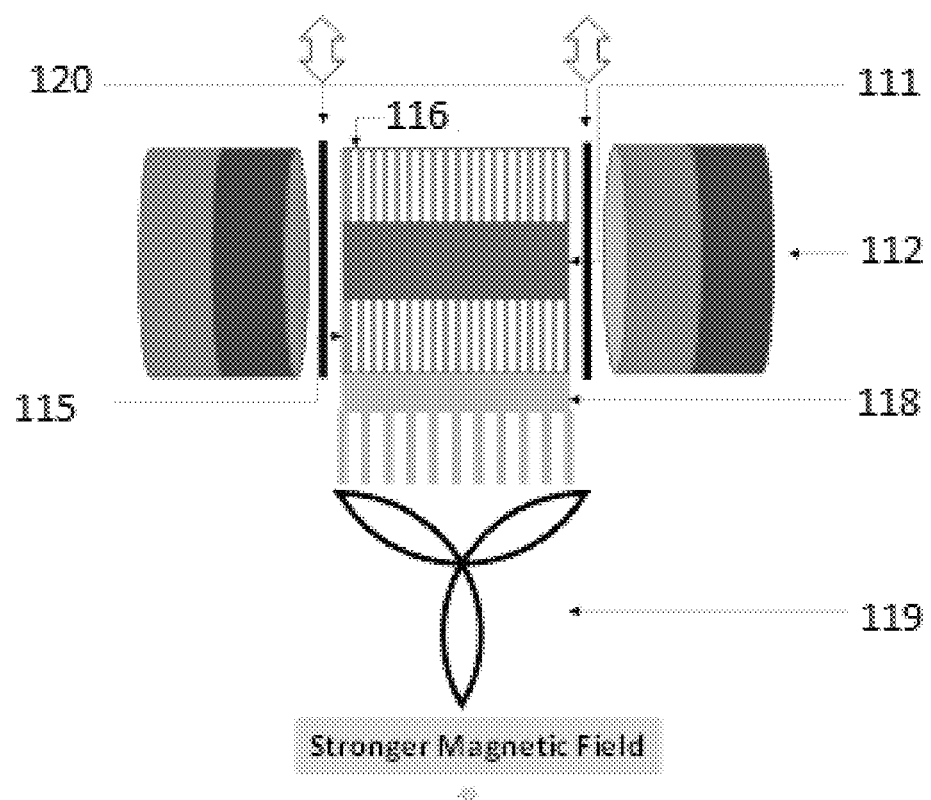
FIG. 7 illustrates an embodiment of a cooling device comprising a hot side, a cold side, at least two thermoelectric layers, at least one magnetocaloric composite, and a magnetic field, wherein the at least one magnetocaloric composite is positioned in between the at least two thermoelectric layers, and wherein the device further comprises a heat sink and convection system.

FIG. 7 illustrates an embodiment of a cooling device comprising a hot side, a cold side, at least two thermoelectric layers, at least one magnetocaloric composite 111, and a magnetic field 112. The at least one magnetocaloric composite is positioned in between the at least two thermoelectric layers 115 and 116. The at least one magnetocaloric composite comprises at least one magnetocaloric material and at least one thermally conductive material with thermal conductivity greater than 75 W/(m K) at the operating temperature of the cooling device, wherein the magnetocaloric material and the thermally conductive material are not the same. The magnetic field enables the magnetocaloric effect of the magnetocaloric material in the magnetocaloric composite when at least one magnetization and demagnetization cycle is performed. The magnetic field is supplied by permanent magnets, wherein a magnetic shielding material 120 is mechanically moved to enable the magnetization and demagnetization cycle. The at least one magnetization and demagnetization cycle comprises magnetizing the magnetocaloric material at a predefined magnetic field ramp-up speed and then the magnetic field is maintained on the magnetocaloric material for a specified holding time, wherein the hot side thermoelectric layer (TEC1) 115 is turned on to allow heat rejection from the magnetocaloric composite, then the magnetocaloric material is demagnetized at a predefined ramp-down speed and zero magnetic field is maintained on the magnetocaloric material for a specified removed time, wherein the cold side thermoelectric layer (TEC2) 116 is turned on to allow heat absorption to the magnetocaloric composite from the cold side. The device further comprises a heat sink 118 and a fan 119 to increase heat removal from the device. In this embodiment, the stationary magnet with magnetic shield may provide a higher magnetic field force.

The temperature variation of the magnetocaloric material occurs with the application and removal of a magnetic field. The cooling device therefore requires a magnetic field force, which can be generated by permanent magnets. In some embodiments the cooling device comprises a permanent magnet. In some embodiments, the permanent magnet is selected from the group consisting of rare earth magnets, ceramic magnets, AlNiCo based magnets, or any combination thereof. In some embodiments, the permanent magnet comprises a material is selected from NdFeB, AlNiCo, SmCo, Ferrite, Femite, FeCrCo, or any combination thereof. The magnitude of the magnetic field will vary depending on distance from the surface of the magnet. In some embodiments, the permanent magnet has a magnetic field at the surface of the magnet of between about 0.01 Tesla to about 2 Tesla. In some embodiments, the permanent magnet has a magnetic field at the surface of the magnet of between about 0.1 Tesla to about 1.6 Tesla. In some embodiments, the permanent magnet has a magnetic field at the surface of the magnet of between about 0.4 Tesla to about 1.2 Tesla.

Additional materials and components may be incorporated into the cooling device. In some embodiments, the cooling device further comprises electrically conductive materials such as, but not limited to, copper plates or wires, alumina plates or wires, or electrically conductive adhesives, or soldering material. In some embodiments, the cooling device further comprises non-conductive materials such as, but not limited to, substrates such as ceramic plates, ceramic spacers, metal oxide casings, adhesives, sealing polymer materials. In some embodiments, the cooling device further comprises magnetic shield materials that act to block the magnetic field from a specified area of the device. In some embodiments, the magnetic shield materials comprise a soft magnetic material. In some embodiments, soft-magnetic materials include Fe—Ni alloys, alloys based on Fe and Co, Fe—Al alloys, Fe—Si—Al alloys, alloys based on Fe—CoNi, or any combination thereof.

Magnetocaloric refrigerators often incorporate a fluid system to remove heat generated by the magnetocaloric material. In some embodiments the cooling device may further comprise a fluid system designed to remove the heat generated by the magnetocaloric material or materials. In some embodiments, the fluid may be a gas such as, but not limited to, air, or a liquid, such as, but not limited to, water. In some embodiments the fluid may be pumped through the cooling device. In some embodiments, a fan may be used to flow air through the device.

Some embodiments of the invention provide a method of removing unwanted heat from an apparatus or a surface comprising adhering the cool side of the disclosed cooling device to a surface of the apparatus, applying a DC current in a specified direction to activate the thermoelectric heat flux of the thermoelectric element, activating the mechanical movement system to perform the at least one magnetization and demagnetization cycle. In some embodiments of the method, the hot side of the cooling device further comprises a heat sink and/or a convection cooling system.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the example embodiments which follow.

EXAMPLES

Figure 8:
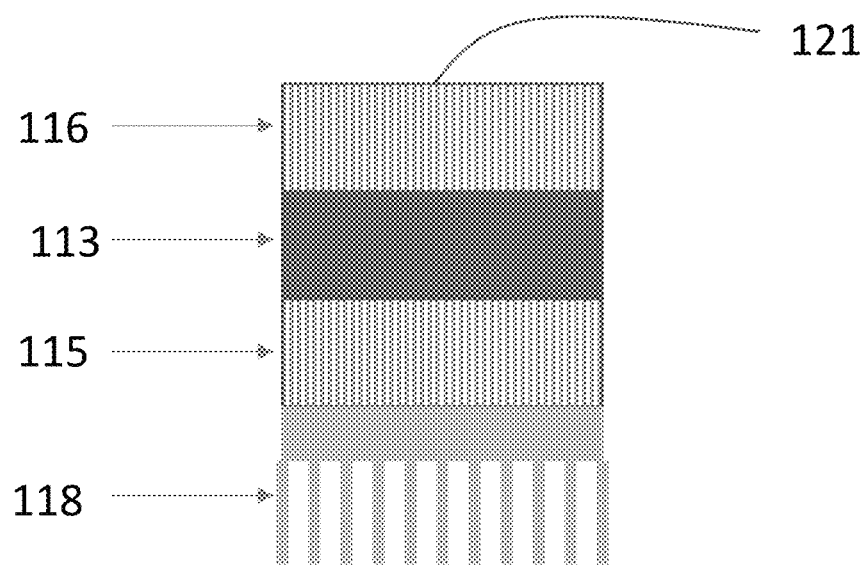
FIG. 8 illustrates a comparative example device and the time versus temperature data for the device at specified conditions.

The object of this current invention is to provide a solid state cooling device useful for cooling applications. FIG. 8 illustrates a solid state device which does not comprise the disclosed invention. FIGS. 9-12 illustrate example embodiments of the invention. The embodiments will be explained with respect to preferred embodiments which are not intended to limit the present invention. Further, in the present disclosure where conditions and/or structures are not specified, the skilled artisan in the art can readily provide such conditions and/or structures, in light of the teachings herein, as a matter of routine experimentation.

Comparative—Example 1

FIG. 8 shows the temperature versus time of a solid state cooling module which uses only a magnetocaloric material 113 and does not incorporate a thermally conductive material. The module was constructed using two commercially available thermoelectric modules (115 and 116) (purchased from Custom Thermoelectrics, Inc.), wherein the magnetocaloric material comprises two solid Gd plates 1 in×1 in×1 mm in size which were purchased from Sigma Aldrich. The Gd plates were adhered in between the thermoelectric modules. A heat sink 118 is adhered to the hot side of the device. A temperature sensor 121 is placed on the cold side of the device. FIG. 8 shows the temperature versus time for the device. During the first 100 seconds the device is allowed to stabilize without introduction of the magnetic field. The thermoelectric modules are cycled off and on every 8 seconds using 1V of DC current, causing the cold side temperature to fluctuate from 22.4 C to 23.4 C. During 100-300 seconds the device is then moved in and out of the magnetic field, which is supplied by an electromagnet with uniform field of 0.8 Tesla. The magnetization and demagnetization cycle is performed as follows: (i) the device is moved into the magnetic field at a ramp-up speed of 0 T to 0.8 T in <1 second, (ii) and then the magnetic field is maintained on the magnetocaloric material for 8 seconds while the hot side thermoelectric layer 115 is on to allow heat rejection from the magnetocaloric material, (iii) then the magnetocaloric material is demagnetized at a ramp-down speed of 0.8 T to 0 T magnetic field in <1 second, (iv) the device is held outside the magnetic field for 8 seconds while the cold side thermoelectric layer 116 is on to allow heat absorption to the magnetocaloric material from the cold side.

FIG. 8 shows no change in the cold side temperature when the magnetization and demagnetization cycles are performed. This is due to the low thermal conductivity of the magnetocaloric material.

Example 2

Figure 9:
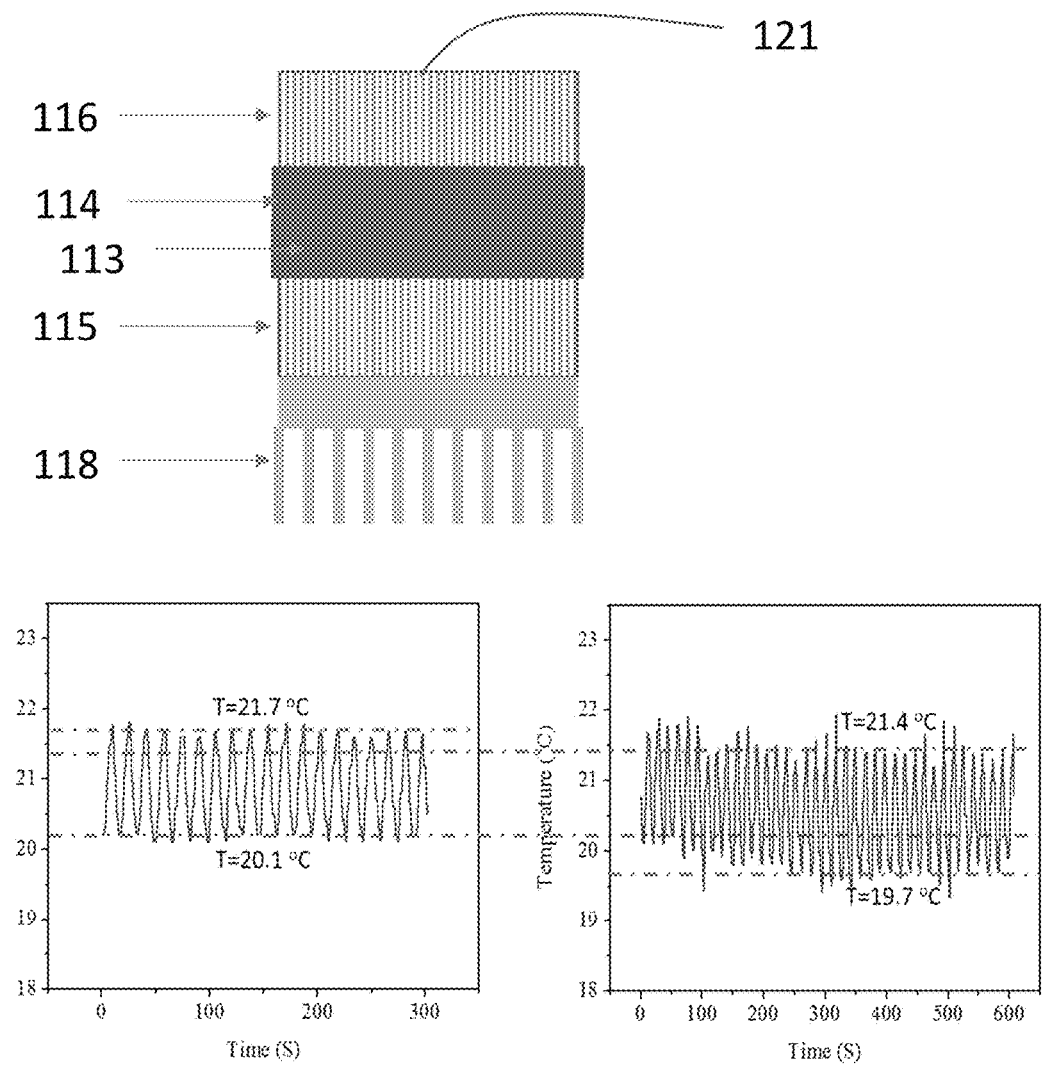
FIG. 9 illustrates an embodiment of a cooling device and the time versus temperature data for the device at specified conditions.

FIG. 9 shows the temperature versus time of an embodiment of the invention where the solid state cooling module uses a magnetocaloric composite comprising a magnetocaloric material 113 and a thermally conductive material 114. The module was constructed similar to Comparative Example 1, except the Gd plates 113 were each wrapped with Copper foil 114 and adhered in between the thermoelectric modules.

FIG. 9 shows the temperature versus time for the device where the figure on the left shows the stabilized temperature fluctuation of the cold side without the magnetic field. The thermoelectric modules are cycled off and on every 8 seconds, causing the cold side temperature to fluctuate from 20.1 C to 21.7 C. When the magnetization and demagnetization cycle is performed on the device using the same procedure as described in Comparative Example 1, the cold side temperature decreases, and fluctuates between 19.7 C and 21.4 C. This shows cooling occurring due to the magnetocaloric effect, which is made possible only by using the magnetocaloric composite structure as disclosed herein.

Example 3

Figure 10:
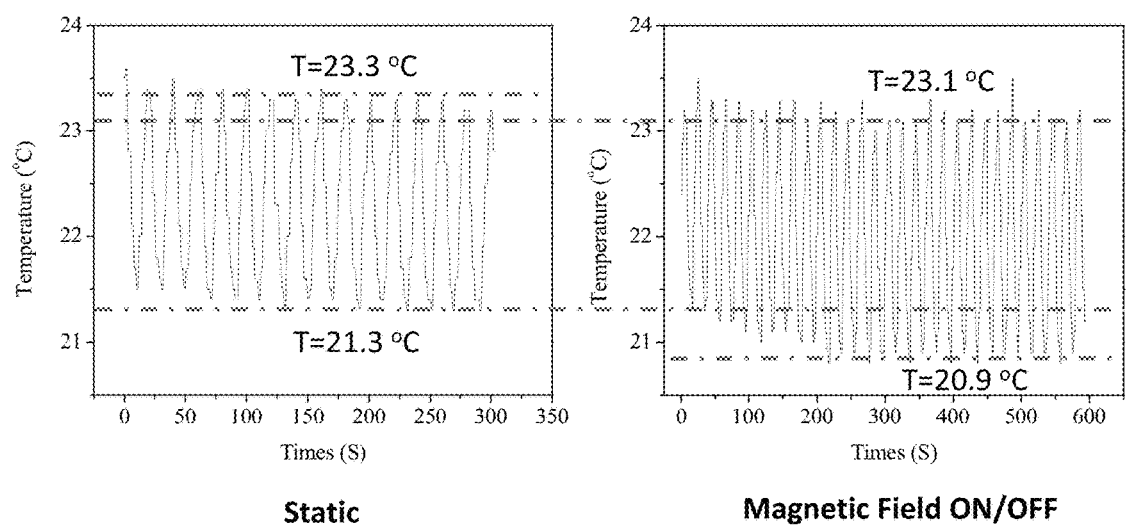
FIG. 10 shows the time versus temperature data for a device at specified conditions.

FIG. 10 shows the temperature versus time of the same solid state cooling module of Example 2, except the cycle time is every 10 seconds. The stabilized cold side temperature fluctuates from 21.3 C to 23.3 C. When the magnetization and demagnetization cycle is performed on the device using the same procedure as described in Comparative Example 1, the cold side temperature decreases, and fluctuates between 20.9 C and 23.1 C. This shows cooling occurring due to the magnetocaloric effect, which is made possible only by using the magnetocaloric composite structure as disclosed herein.

Example 4

Figure 11:
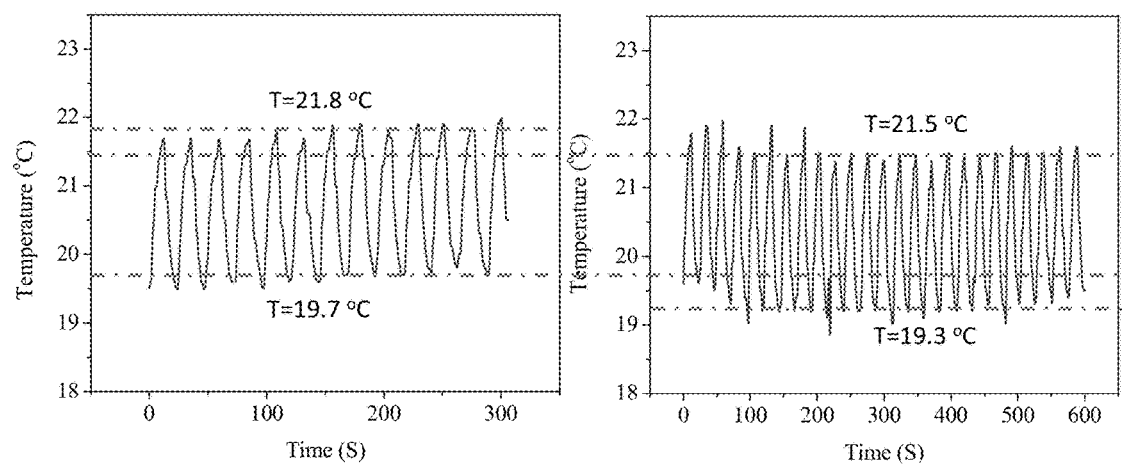
FIG. 11 shows the time versus temperature data for a device at specified conditions.

FIG. 11 shows the temperature versus time of the same solid state cooling module of Example 2, except the cycle time is every 12 seconds. The stabilized cold side temperature fluctuates from 19.7 C to 21.8 C. When the magnetization and demagnetization cycle is performed on the device using the same procedure as described in Comparative Example 1, the cold side temperature decreases, and fluctuates between 19.3 C and 21.5 C. This shows cooling occurring due to the magnetocaloric effect, which is made possible only by using the magnetocaloric composite structure as disclosed herein.

Example 5

Figure 12:
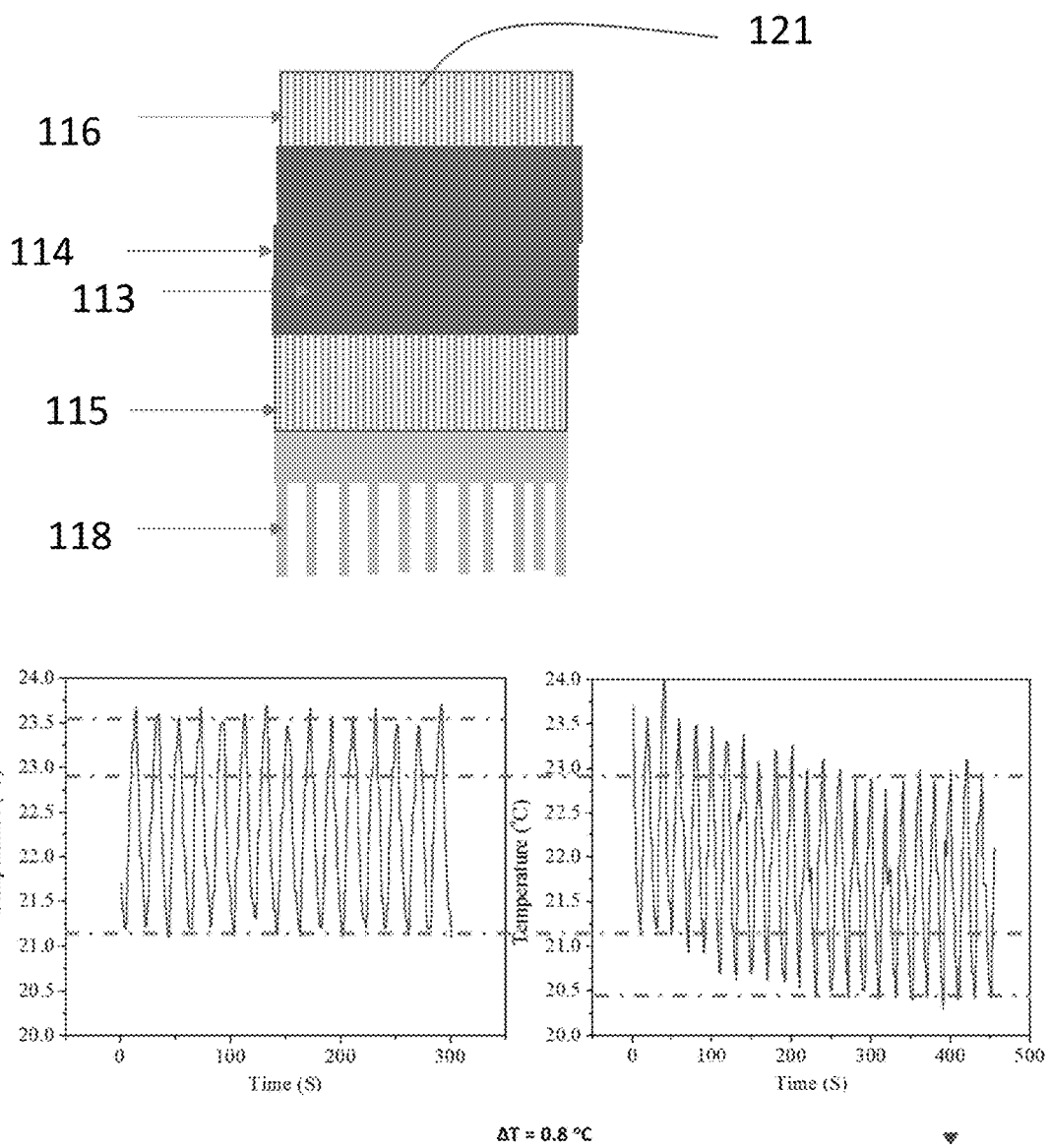
FIG. 12 illustrates an embodiment of a cooling device and the time versus temperature data for the device at specified conditions.

FIG. 12 shows the temperature versus time of the same solid state cooling module of Example 3, where the cycle time is every 10 seconds, but the number of Gd plates 113 is increased to 4, where each plate is wrapped with copper foil 114. The stabilized cold side temperature fluctuates from 21.1 C to 23.5 C. When the magnetization and demagnetization cycle is performed on the device using the same procedure as described in Comparative Example 1, the cold side temperature decreases, and fluctuates between 20.5 C and 23.0 C. By using the magnetocaloric composite structure, even large amounts of magnetocaloric material are possible, allowing larger heat removal capacity for the solid state cooling device.

Example 6

Figure 13:
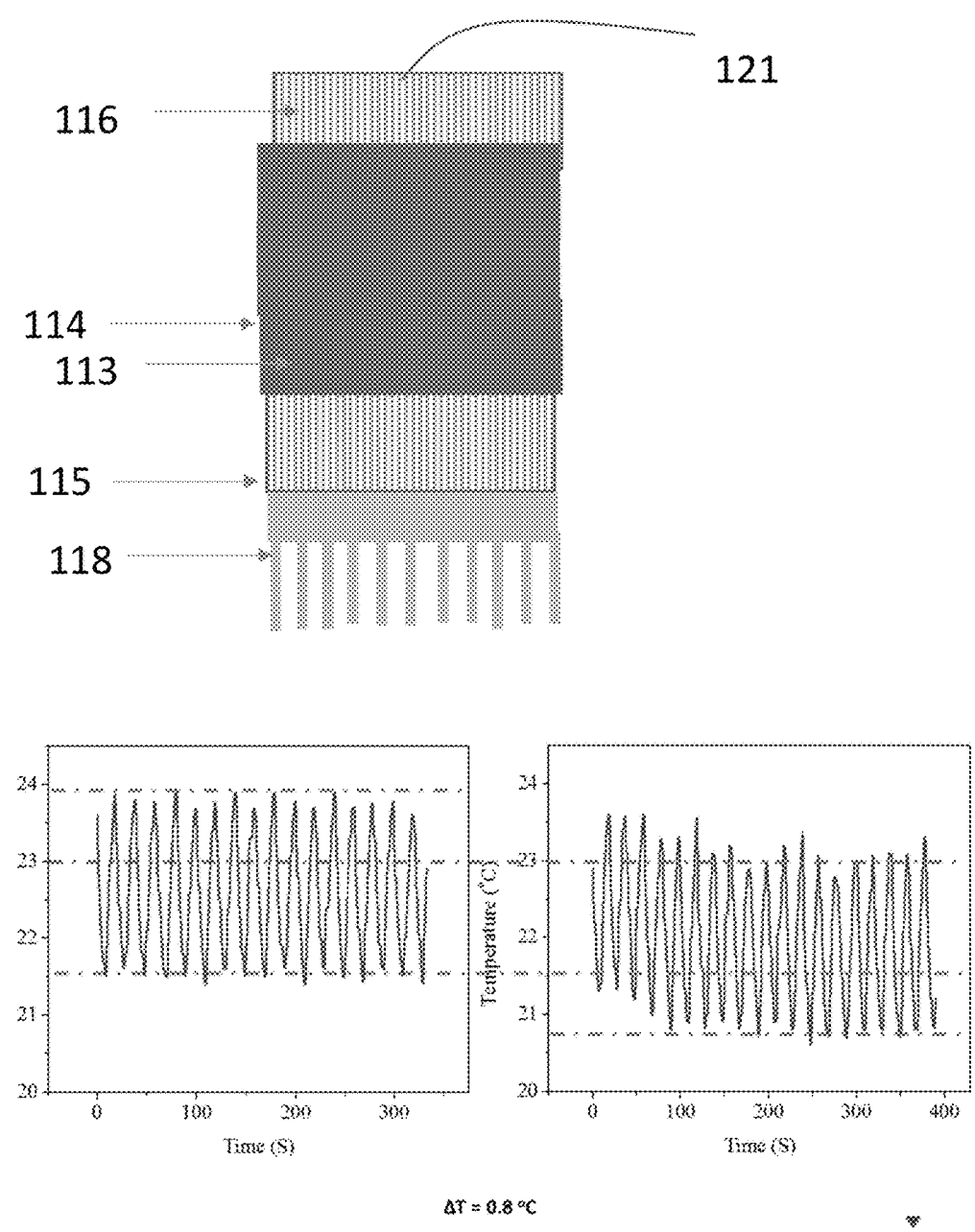
FIG. 13 illustrates an embodiment of a cooling device and the time versus temperature data for the device at specified conditions.

FIG. 13 shows the temperature versus time of the same solid state cooling module of Example 5, where the cycle time is every 10 seconds, but the number of Gd plates 113 is increased to 6, where each plate is wrapped with copper foil 114. The stabilized cold side temperature fluctuates from 21.5 C to 24.0 C. When the magnetization and demagnetization cycle is performed on the device using the same procedure as described in Comparative Example 1, the cold side temperature decreases, and fluctuates between 20.7 C and 23.0 C. By using the magnetocaloric composite structure, even large amounts of magnetocaloric material are possible, allowing larger heat removal capacity for the solid state cooling device.

The object of this current invention is to provide a solid-state cooling device which utilizes both thermoelectric and magnetocaloric mechanisms to achieve a high efficiency cooling device. As illustrated by the above example embodiments, the solid state cooling device as disclosed herein, enables the utilization of the magnetocaloric effect to provide high efficiency cooling using large quantities of magnetocaloric material so that the device is viable for practical applications. This device may be useful for many applications including cooling of microelectronic devices.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein. It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A cooling device comprising a hot side, a cold side, at least two thermoelectric layers, at least one magnetocaloric composite, and a magnet configured to provide a magnetic field; wherein
  the at least one magnetocaloric composite is positioned in between the at least two thermoelectric layers; and wherein
  the at least one magnetocaloric composite comprises at least one magnetocaloric material and at least one thermally conductive material with thermal conductivity greater than 75 W/(m K) at an operating temperature of the cooling device, wherein the magnetocaloric material and the thermally conductive material are not the same;
  wherein the magnetic field enables the magnetocaloric effect of the magnetocaloric material in the magnetocaloric composite when at least one magnetization and demagnetization cycle is performed, wherein a change in temperature of the magnetocaloric material occurs when the magnetic field applied to the material is increased or decreased;
  wherein the at least one magnetization and demagnetization cycle comprises increasing the magnetic field force on the magnetocaloric material at a predefined magnetic field ramp-up speed, maintaining the increased magnetic field on the magnetocaloric material for a specified holding time, decreasing the magnetic field force on the magnetocaloric material at a predefined ramp-down speed, and maintaining the decreased magnetic field on the magnetocaloric material for a specified holding time; and
  wherein the at least two thermoelectric layers operate separately to move heat from the cold side of the device to the hot side of the device when a DC current is applied in a specified direction, wherein the DC current applied to each thermoelectric layer is electrically coupled to the magnetization and demagnetization cycle of the magnetocaloric material such that a first thermoelectric layer operates to allow heat rejection from the magnetocaloric composite to the hot side and a second thermoelectric layer operates to allow heat absorption to the magnetocaloric composite from the cold side.

2. The device of claim 1, wherein the thermoelectric layers comprise commercially available thermoelectric cooling modules.

3. The device of claim 1, wherein the thermoelectric layers comprise pellets of at least one p-type thermoelectric material and at least one n-type thermoelectric material, and wherein the pellets are arranged electrically in series and thermally in parallel.

4. The device of claim 3, wherein the thermoelectric material in the thermoelectric layers comprises a material selected from the group consisting of bismuth based alloys, lead telluride based alloys, carbon based materials, inorganic clathrate materials, magnesium based materials, silicides, skutterudite materials, oxide materials, Half Heusler alloys, silicon-germanium based materials, sodium-cobalt based materials, or any combination thereof.

5. The device of claim 4, wherein the thermoelectric pellets comprise at least one nano-grained material, wherein the nano-grained material has at least one of its dimensions in the range of about 1 nm to about 100 nm.

6. The device of claim 1, wherein the magnetocaloric composite comprises alternating layers of magnetocaloric material and thermally conductive material.

7. The device of claim 6, wherein the thickness of at least one of the layers of magnetocaloric material within the magnetocaloric composite is between about 100 nm and about 2 mm.

8. The device of claim 7, wherein the thickness of at least one of the layers of thermally conductive material is between about 10 nm and about 1 mm.

9. The device of claim 8, wherein the magnetocaloric material is selected from the group consisting of Gd, Gd based alloys, NiMn based alloys, La based alloys, Nd based alloys, Dy based alloys, Pr based alloys, MnAs based alloys, Er based alloys, Tm based alloys, FeNi based alloys, and any combination thereof.

10. The device of claim 8, wherein the temperature of the magnetocaloric material increases when it is magnetized, and wherein the temperature of the magnetocaloric material decreases when it is demagnetized.

11. The device of claim 8, wherein the thermally conductive material is selected from the group consisting of copper, aluminum, diamond, gold, silver, brass, steel, graphene, graphite, iron, lead, nickel, indium, tin, tungsten, zinc, or any combination thereof.

12. The device of claim 11, wherein the thermally conductive material has a thermal conductivity greater than 200 W/(m K).

13. The device of claim 1, wherein the magnetocaloric composite is electrically isolated from the thermoelectric layers.

14. The device of claim 1, wherein the magnet comprises a permanent magnet.

15. The device of claim 14, wherein the permanent magnet is selected from the group consisting of a rare earth magnet, ceramic magnets, AlNiCo based magnets, or any combination thereof.

16. The device of claim 15, wherein the permanent magnet material is selected from NdFeB, AlNiCo, SmCo, Ferrite, Femite, FeCrCo, or any combination thereof.

17. The device of claim 16, wherein the permanent magnet has a magnetic field of between about 0.01 Tesla to about 2 Tesla.

18. The device of claim 1, further comprising metal or ceramic plates, metal or ceramic wires, metal or ceramic foil, metal or ceramic spacers, metal or ceramic substrates, soft magnetic shielding materials, adhesives, soldering materials, or any combination thereof.

19. A method of removing unwanted heat from an apparatus or a surface comprising:
a) adhering the cool side of the cooling device of claim 1 to a surface of the apparatus,
b) applying the DC currents in a specified direction to separately activate the thermoelectric layers,
c) activating a magnetic field system to perform the at least one magnetization and demagnetization cycle.

20. The method of claim 19, wherein the hot side of the cooling device further comprises a heat sink, a convection cooling system, or a combination thereof.

* * * * *